(12) United States Patent
Lee et al.

(10) Patent No.: US 9,171,827 B2
(45) Date of Patent: Oct. 27, 2015

(54) STACK TYPE SEMICONDUCTOR PACKAGE

(71) Applicants:Jin-Ho Lee, Gwacheon-si (KR);
Hee-Seok Lee, Yongin-si (KR); Se-Ho You, Seoul (KR); Jeong-Oh Ha, Hwaseong-si (KR)

(72) Inventors: Jin-Ho Lee, Gwacheon-si (KR);
Hee-Seok Lee, Yongin-si (KR); Se-Ho You, Seoul (KR); Jeong-Oh Ha, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/148,717

(22) Filed: Jan. 6, 2014

(65) Prior Publication Data

US 2014/0291868 A1    Oct. 2, 2014

(30) Foreign Application Priority Data

Mar. 29, 2013    (KR) .......................... 10-2013-0034724

(51) Int. Cl.
*H01L 23/00*    (2006.01)
*H01L 25/10*    (2006.01)
(Continued)

(52) U.S. Cl.
CPC ............ *H01L 25/105* (2013.01); *H05K 1/0271* (2013.01); *H01L 23/3128* (2013.01); *H01L 24/13* (2013.01); *H01L 24/16* (2013.01); *H01L 24/45* (2013.01); *H01L 24/48* (2013.01); *H01L 24/73* (2013.01); *H01L 24/81* (2013.01); *H01L 2224/13101* (2013.01); *H01L 2224/13124* (2013.01); *H01L 2224/13139* (2013.01); *H01L 2224/13144* (2013.01); *H01L 2224/13147* (2013.01); *H01L 2224/13169* (2013.01); *H01L 2224/16225* (2013.01); *H01L 2224/32145* (2013.01); *H01L 2224/32225* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/45157* (2013.01); *H01L 2224/45164* (2013.01); *H01L 2224/45166* (2013.01); *H01L 2224/45169* (2013.01);
(Continued)

(58) Field of Classification Search
CPC ......... H01L 24/69; H01L 24/89; H01L 21/56; H01L 21/563; H01L 23/28; H01L 2225/06548; H01L 23/4012; H01L 25/043; H01L 2224/40221
USPC ................................................. 257/686, 777
See application file for complete search history.

(56) References Cited

U.S. PATENT DOCUMENTS 7,816,183 B2    10/2010  Kawata
7,847,384 B2    12/2010  Kobayashi et al.
(Continued)

FOREIGN PATENT DOCUMENTS

JP       2007281129 A    10/2007
KR       100617071 B1    8/2006

*Primary Examiner* — Peniel M Gumedzoe
(74) *Attorney, Agent, or Firm* — Renaissance IP Law Group LLP

(57) ABSTRACT

A stack type semiconductor package includes a lower semiconductor package including a lower package substrate and at least one lower semiconductor chip disposed on the lower package substrate; an upper semiconductor package including an upper package substrate larger than the lower package substrate and at least one upper semiconductor chip disposed on the upper package substrate; an inter-package connector connecting an upper surface of the lower package substrate to a lower surface of the upper package substrate; and a filler filling in between the lower package substrate and the upper package substrate while substantially surrounding the inter-package connector.

15 Claims, 26 Drawing Sheets

(51) Int. Cl.
*H05K 1/02* (2006.01)
*H01L 23/31* (2006.01)
*H05K 3/28* (2006.01)

(52) U.S. Cl.
CPC ............... *H01L2224/45171* (2013.01); *H01L 2224/48091* (2013.01); *H01L 2224/48227* (2013.01); *H01L 2224/73204* (2013.01); *H01L 2224/73265* (2013.01); *H01L 2224/81815* (2013.01); *H01L 2224/85401* (2013.01); *H01L 2224/85444* (2013.01); *H01L 2224/85447* (2013.01); *H01L 2224/85455* (2013.01); *H01L 2924/1815* (2013.01); *H01L 2924/18161* (2013.01); *H05K 3/284* (2013.01); *H05K 2201/09136* (2013.01); *H05K 2201/09909* (2013.01); *H05K 2201/10734* (2013.01)

(56) References Cited

U.S. PATENT DOCUMENTS

| | | | |
|---|---|---|---|
| 7,999,368 | B2 | 8/2011 | Yim et al. |
| 2008/0211078 | A1* | 9/2008 | Kwon et al. .................. 257/686 |
| 2008/0251283 | A1 | 10/2008 | Araki |
| 2010/0155920 | A1* | 6/2010 | Lee ............................... 257/686 |
| 2011/0128711 | A1 | 6/2011 | Yim et al. |
| 2011/0210436 | A1* | 9/2011 | Chow et al. .................. 257/686 |
| 2011/0241168 | A1* | 10/2011 | Kim et al. .................... 257/532 |
| 2011/0304035 | A1* | 12/2011 | Kim et al. .................... 257/686 |
| 2012/0061854 | A1 | 3/2012 | Chow et al. |
| 2012/0074586 | A1 | 3/2012 | Seo et al. |
| 2012/0139090 | A1 | 6/2012 | Kim et al. |
| 2012/0153499 | A1 | 6/2012 | Byun et al. |
| 2012/0211885 | A1* | 8/2012 | Choi et al. .................... 257/737 |

* cited by examiner

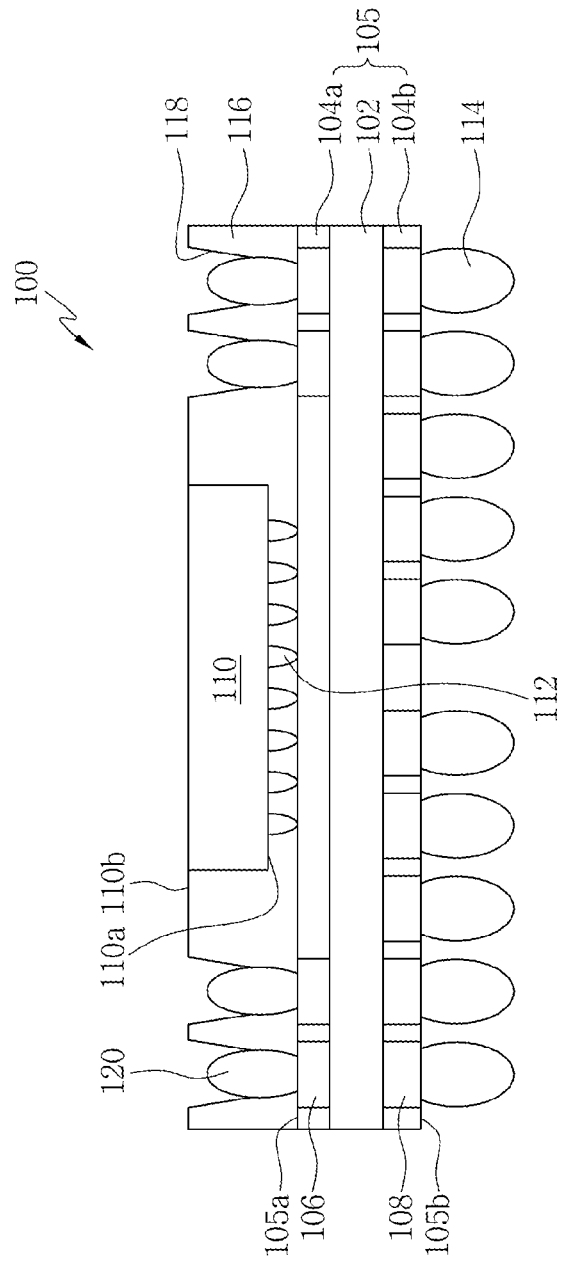

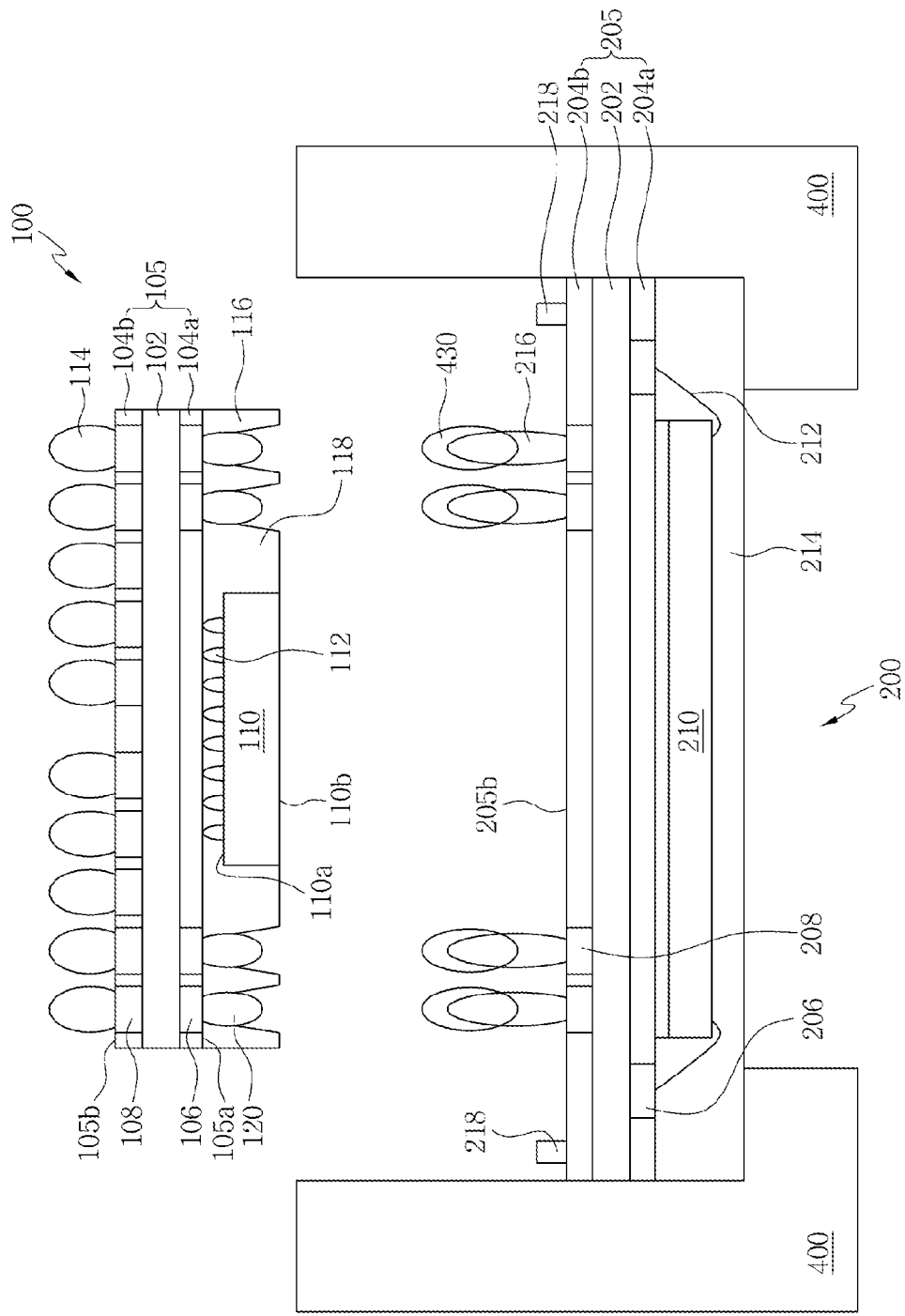

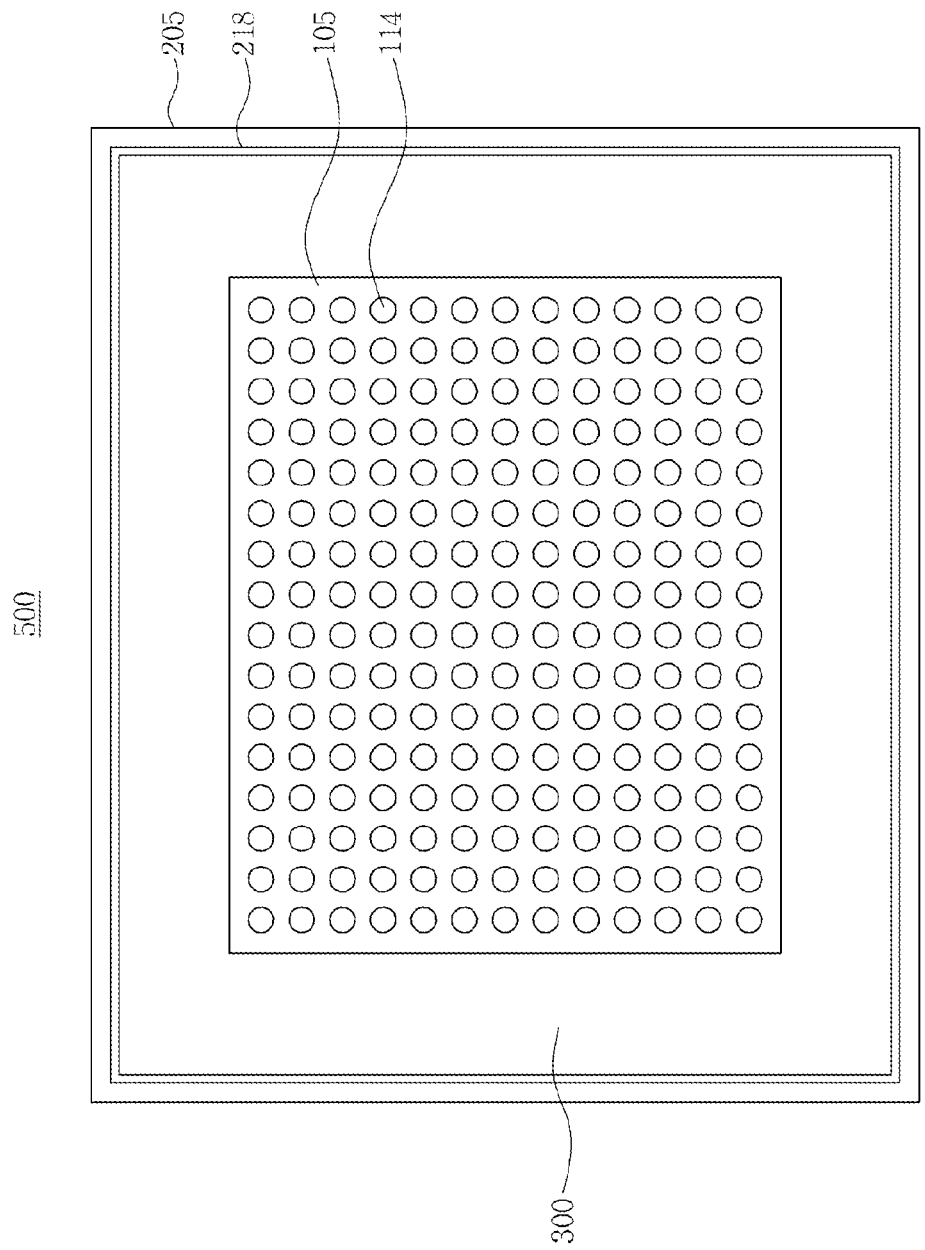

STACK TYPE SEMICONDUCTOR PACKAGE

CROSS-REFERENCE TO RELATED APPLICATION

This application claims priority under 35 U.S.C. §119 to Korean Patent Application No. 10-2013-0034724 filed on Mar. 29, 2013, the disclosure of which is hereby incorporated by reference in its entirety.

BACKGROUND

Embodiments relate to a stack type semiconductor package, and a semiconductor module, an electronic circuit board, and an electronic system each including the stack type semiconductor package.

Stack type semiconductor packages have been suggested to improve the degree of integration of a semiconductor device and provide a miniaturization of an electronic circuit system. However, such stack type semiconductor packages may warp, twist, or otherwise distort during subsequent processing of the packages.

SUMMARY

An embodiment includes a stack type semiconductor package comprising a lower semiconductor package including a lower package substrate and at least one lower semiconductor chip disposed on the lower package substrate; an upper semiconductor package including an upper package substrate larger than the lower package substrate and at least one upper semiconductor chip disposed on the upper package substrate; an inter-package connector connecting an upper surface of the lower package substrate to a lower surface of the upper package substrate; and a filler filling in between the lower package substrate and the upper package substrate while substantially surrounding the inter-package connector.

Another embodiment includes a stack type semiconductor package comprising: a plurality of lower semiconductor packages, each including a lower package substrate and at least one lower semiconductor chip disposed on the lower package substrate; an upper semiconductor package including an upper package substrate larger than the lower package substrates of the lower semiconductor packages and at least one upper semiconductor chip disposed on the upper package substrate; an inter-package connector connecting the lower semiconductor packages to the upper semiconductor package; and a filler filling in between the lower package substrates and the upper package substrate while substantially surrounding the inter-package connectors.

Another embodiment includes a method, comprising: mounting at least one lower semiconductor package on an upper semiconductor package, wherein: the at least one lower semiconductor package includes a lower package substrate and at least one lower semiconductor chip disposed on the lower package substrate; and the upper semiconductor package includes an upper package substrate larger than the lower package substrate and at least one upper semiconductor chip disposed on the upper package substrate; connecting the at least one lower semiconductor package to the upper semiconductor package with inter-package connectors; and forming a filler in between the lower package substrate and the upper package substrate while substantially surrounding the inter-package connectors.

BRIEF DESCRIPTION OF THE DRAWINGS

The foregoing and other features and advantages will be apparent from the more particular description of preferred embodiments, as illustrated in the accompanying drawings in which like reference numerals refer to the same parts throughout the different views. The drawings are not necessarily to scale, emphasis instead being placed upon illustrating the principles. In the drawings:

FIGS. 6A to 6H are cross-sectional views illustrating a method of manufacturing stack type semiconductor packages in accordance with various embodiments;

FIGS. 7A, 7B and 8 are top views illustrating a method of manufacturing stack type semiconductor packages in accordance with various embodiments;

DETAILED DESCRIPTION OF THE EMBODIMENTS

Figure 1:
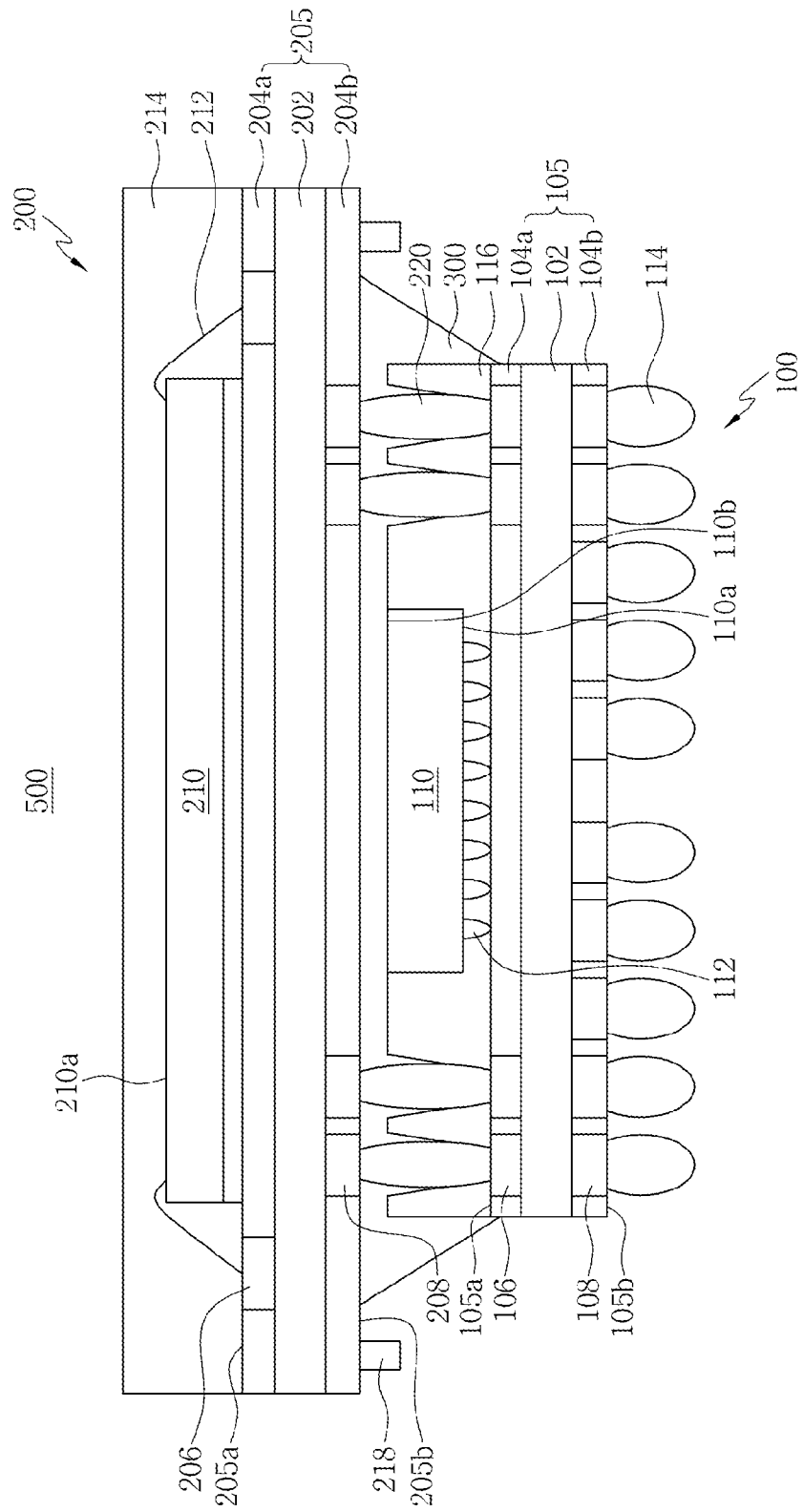
FIGS. 1 to 5 are cross-sectional views of stack type semiconductor packages in accordance with various embodiments.

Various embodiments will now be described more fully with reference to the accompanying drawings in which some embodiments are shown. Embodiments may, however, take different forms and should not be construed as being limited to the embodiments set forth herein. Rather, these embodiments are provided so that this disclosure is thorough and complete and fully conveys the embodiments to those skilled in the art. In the drawings, the sizes and relative sizes of layers and regions may be exaggerated for clarity.

The terminology used herein is for the purpose of describing particular embodiments only and is not intended to be limiting of other embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms first, second, third, etc. may be used herein to describe various elements, components, regions, layers, and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present inventive concept.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 5 are cross-sectional views of stack type semiconductor packages in accordance with various embodiments. Referring to FIG. 1, a stack type semiconductor package 500 in accordance with an embodiment may include a lower semiconductor package 100, an upper semiconductor package 200, an inter-package connector 220 and a filler 300.

The stack type semiconductor package 500 may have a package on package (POP) structure in which the upper semiconductor package 200 is stacked on the lower semiconductor package 100. The lower semiconductor package 100 and the upper semiconductor package 200 each represent a package that is individually packaged and completed with an electrical test. The stack type semiconductor package 500 represents a system-in-package (SIP) in which various types of semiconductor devices having different functions are packaged in a single package, maximizing the performance and efficiency of a product.

The lower semiconductor package 100 may include a lower package substrate 105 and at least one lower semiconductor chip 110 disposed on the lower package substrate 105.

The lower package substrate 105 is a substrate in which a plurality of lower interconnections (not illustrated) are formed, and may include a rigid printed circuit board, a flexible printed circuit board, a rigid-flexible printed circuit board, or other substrate in which interconnections may be formed. The lower package substrate 105 may include a lower core layer 102, a first lower solder resist layer 104a and a second lower solder resist layer 104b. The plurality of lower interconnections may be formed in the lower core layer 102 forming the lower package substrate 105. A ground voltage and a power voltage may be applied to the plurality of lower interconnections.

A plurality of first lower lands 106 insulated by the first lower solder resist layer 104a may be formed at an upper surface 105a of the lower package substrate 105. A plurality of second lower lands 108 insulated by the second lower solder resist layer 104b may be formed at a lower surface 105b of the lower package substrate 105. The first lower lands 106 may be electrically connected to the second lower lands 108 through the lower interconnections. The first and second lower lands 106 and 108 may include copper (Cu), nickel (Ni), gold (Au), a solder material, or the like.

An external connection member 114 may be formed on the second lower lands 108 to electrically connect the stack type semiconductor package 500 to a semiconductor module board or a system board or other suitable device. The external connection member 114 may be formed of a solder material such as a solder ball, a solder bump, a solder paste, or the like, or formed of metal in the shape of a sphere, a mesa, a pin, or the like. The external connection members 114 may be arranged in a grid type to implement a ball grid array (BGA) package.

The lower semiconductor chip 110 may include a logic semiconductor device such as a microprocessor or a microcontroller. The lower semiconductor chip 110 may be a system on chip (SOC) having various types of semiconductor devices included in a single semiconductor chip. The lower semiconductor chip 110 may be connected to the lower package substrate 105 through a flip chip technique or a wire-bonding technique. For example, the lower semiconductor chip 110 may be a flip chip package (FCP) obtained by disposing an active surface 110a, on which chip pads are formed, to face the upper surface 105a of the lower package substrate 105, and then directly connecting to the lower package substrate 105 using conductive chip bumps 112 each disposed on the chip pads. Although the lower semiconductor chip 110 on FIG. 1 has been illustrated as being flip chip bonded to the lower package substrate 105, the lower semiconductor chip 110 may be connected to the lower package substrate 105 through a chip pad and a conductive wire, or other connection techniques.

If the lower semiconductor chip 110 is a flip chip package, the chip pads formed on the active surface 110a of the lower semiconductor chip 110 may be electrically connected to the first lower lands 106 through the chip bumps 112 and the lower interconnections. The chip bumps 112 may include solder material, metal, or the like. If the chip bumps 112 are solder bumps, the chip bumps 112, after a solder reflow process, may be kept in a ball shape due to a surface tension effect, and if the chip bumps 112 are metal bumps such as gold, the chip bumps 112 may be provided in the form of a mesa.

The lower semiconductor package 100 may further include a lower encapsulant 116 formed on the lower package substrate 105 while surrounding a side of the lower semiconductor chip 110. The lower encapsulant 116 protects electrical connection between the lower semiconductor chip 110 and the lower package substrate 105, and may or may not be formed on an upper surface 110b of the lower semiconductor chip 110. That is, the lower encapsulant 116 may expose the upper surface 110b of the lower semiconductor chip 110, thereby lowering the overall height of the stack type semiconductor package 500. The lower encapsulant 116 may include an epoxy resin, an epoxy mold compound (EMC), or the like. As needed, the lower encapsulant 116 may be formed on the lower surface 105b of the lower package substrate 105 to protect the second lower solder resist layer 104b while stably supporting the external connection member 114.

The upper semiconductor package 200 is vertically stacked on the lower semiconductor package 100, and may include an upper package substrate 205 having a size larger than that of the lower package substrate 105 and at least one upper semiconductor chip 210 disposed on the upper package substrate 205.

The upper package substrate 205 is a substrate in which a plurality of upper interconnections (not illustrated) are formed, and may include a rigid printed circuit board, a flexible printed circuit board, a rigid-flexible printed circuit board, or other substrate in which interconnections may be formed. The upper package substrate 205 may include an upper core layer 202, a first upper solder resist layer 204a and a second upper solder resist layer 204b. The plurality of upper interconnections may be formed in the upper core layer 202 forming the upper package substrate 205. A ground voltage and a power voltage may be applied to the plurality of upper interconnections.

A plurality of first upper lands 206 insulated by the first upper solder resist layer 204a may be formed at an upper surface 205a of the upper package substrate 205. A plurality of second upper lands 208 insulated by the second upper solder resist layer 204b may be formed at a lower surface 205b of the upper package substrate 205. The first upper lands 206 may be electrically connected to the second upper lands 208 through the upper interconnections. The first and second upper lands 206 and 208 may include copper (Cu), nickel (Ni), gold (Au), a solder material, or the like. For convenience sake of description, only two of the upper lands 206 are illustrated on FIG. 1.

The upper semiconductor chip 210 may have chip pads on an active surface 210a thereof, and include a semiconductor memory device. In order to increase a memory capacity, the size of the upper semiconductor chip 210 may need to be increased or a plurality of upper semiconductor chips may need to be stacked in a vertical or horizontal direction, and thus the upper package substrate 205 on which the upper semiconductor chip 210 is mounted may have a size larger than the lower package substrate 105.

The upper semiconductor chip 210 may be connected to the upper package substrate 205 through a wire bonding technique, a flip chip technique, or the like. For example, the chip pads formed on the active surface 210a of the upper semiconductor chip 210 may be electrically connected to the first upper land 206 of the upper package substrate 205 through a wire 212. Although the upper semiconductor chip 210 on FIG. 1 has been illustrated as being connected to the upper package substrate 205 through a wire-bonding scheme, the upper semiconductor chip 210 may be directly connected to the upper package substrate 205 through a flip chip technique, or other connection technique.

The upper semiconductor package 200 may further include an upper encapsulant 214 formed on the upper package substrate 205 while surrounding and protecting the active surface 210a of the upper semiconductor chip 210 and the wire 212. The upper encapsulant 214 may include an epoxy resin, an epoxy mold compound (EMC), or the like.

The inter-package connector 220 may be disposed between the first lower land 106 of the lower package substrate 105 and the second upper land 208 of the upper package substrate 205 to electrically connect the lower semiconductor package 100 to the upper semiconductor package 200. The inter-package connector 220 may include a solder material, or other conductive material or structure. For example, the inter-package connector 220 may be formed of a solder ball.

The filler 300 may be formed to fill in between the lower package substrate 105 and the upper package substrate 205 while surrounding the inter-package connector 220. The filler 300 may be formed to surround the lower encapsulant 116 on the lower package substrate 105. The filler 300 may be formed of an underfill resin such as an epoxy resin or a polymer-based material. In addition, the filler 300 may include a silica filler or a silica flux.

A solder joint reliability of the inter-package connector 220 includes a component reliability and a board level reliability. The board level reliability represents a solder joint reliability at an interface between a solder and a package or a solder and a board with respect to a shock/drop stress or a thermal cycle stress in a state that a semiconductor package is mounted to a semiconductor module board or a system board.

As for the stack type semiconductor package 500 having the upper package substrate 205 larger than the lower package substrate 105, the inter-package connector 220 is exposed without being sealed, thereby being significantly vulnerable to an external shock or thermal cycle. Since the filler 300 substantially, or alternatively, completely fills a gap between the lower package substrate 105 and the upper package substrate 205 to protect the inter-package connector 220, the mechanical stress or thermal stress applied to the inter-package connector 220 is relieved, thereby substantially preventing a crack from occurring on the inter-package connector 220. Accordingly, the filler 300 may improve the board level reliability of the inter-package connector 220.

In addition, since the filler 300 improves the stiffness of the stack type semiconductor package 500, warping, twisting, or the like of the package substrate may be substantially prevented when an additional reflow process is performed on the stack type semiconductor package 500 by use of a surface mount technology (SMT).

The upper package substrate 205 may further include a dam 218 formed along a periphery of the lower surface 205b of the upper package substrate 205. The dam 218 may be formed by printing a solder resist layer during a manufacturing process of the upper package substrate 205, and may serve to substantially prevent the filler 300 from overflowing.

In describing stack type semiconductor packages in accordance with various embodiments, description of the parts substantially identical to those according to the previous embodiment will be omitted, and the following description will be made in relation to a modified part from the above-described embodiment.

Figure 2:
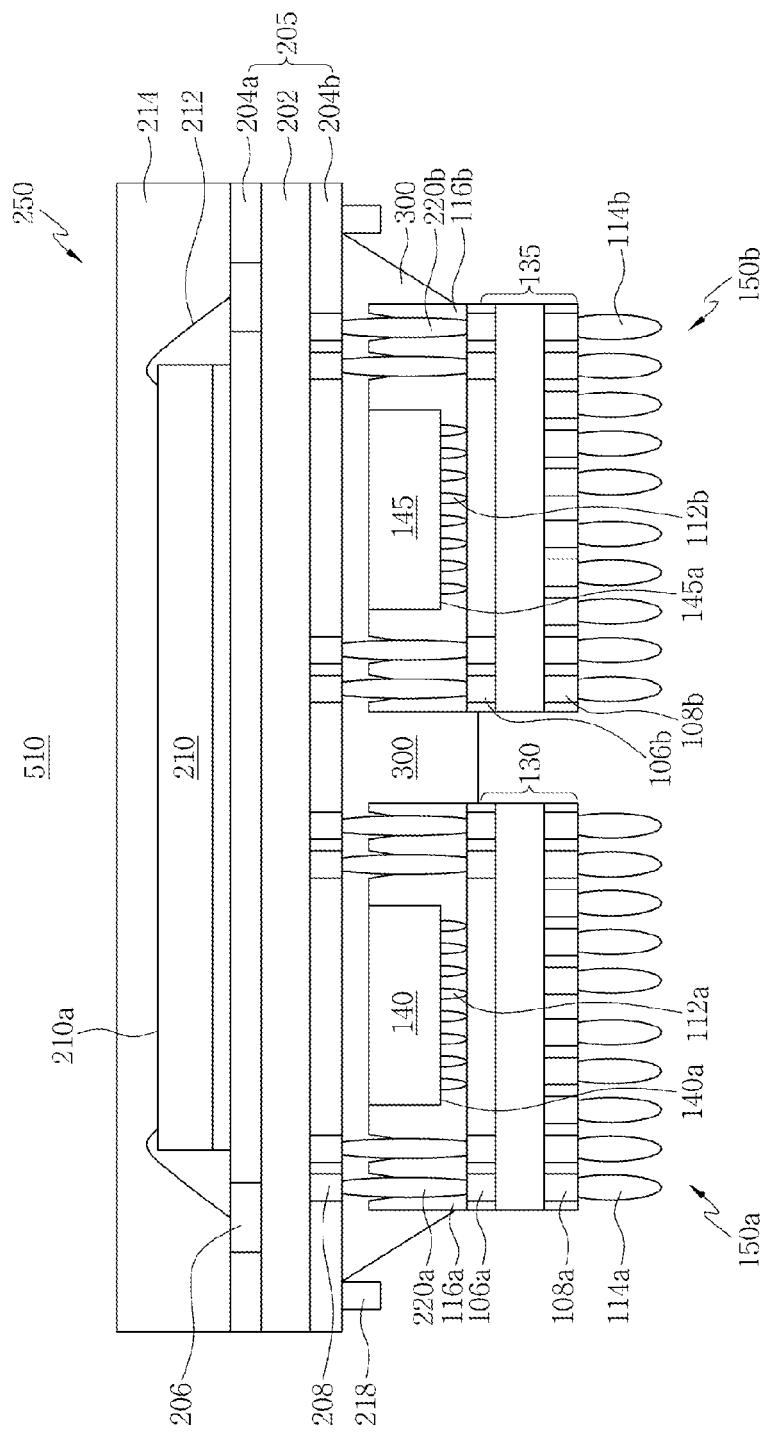

Referring to FIG. 2, a stack type semiconductor package 510 in accordance with an embodiment includes a first lower semiconductor package 150a, a second lower semiconductor package 150b, an upper semiconductor package 250, a first inter-package connector 220a, a second inter-package connector 220b, and a filler 300.

The stack type semiconductor package 510 may have two or more lower semiconductor packages mounted below the upper semiconductor package 250. For example, the first lower semiconductor package 150a may include a SOC chip and the second lower semiconductor package 150b may include a modem.

The first lower semiconductor package 150a includes a first lower package substrate 130, at least one first lower semiconductor chip 140 disposed on the first lower package substrate 130, and a first lower encapsulant 116a formed on the first lower package substrate 130 while surrounding sides of the first lower semiconductor chip 140.

The second lower semiconductor package 150b includes a second lower package substrate 135, at least one second lower semiconductor chip 145 disposed on the second lower package substrate 135, and a second lower encapsulant 116b formed on the second lower package substrate 135 while surrounding sides of the second lower semiconductor chip 145.

Multiple first lower lands 106a and 106b may be formed at upper surfaces of the first and second lower package substrates 130 and 135. Multiple second lower lands 108a and 108b may be formed at lower surfaces of the first and second lower package substrates 130 and 135. The first lower lands 106a and 106b may be electrically connected to the second lower lands 108a and 108b through lower interconnections. External connection members 114a and 114b may be formed on the second lower lands 108a and 108b to electrically connect the stack type semiconductor package 510 to the semiconductor module board or the system board.

The first and second lower semiconductor chips 140 and 145 may be connected to the first and second lower package substrates 130 and 135, respectively, through a flip chip scheme, a wire bonding scheme, or the like. For example, chip pads formed on active surfaces 140a and 145a of the first and second lower semiconductor chips 140 and 145 may be electrically connected to the first lower lands 106a and 106b through first and second chip bumps 112a and 112b and the lower interconnections.

The upper semiconductor package 250 may include an upper package substrate 205, at least one upper semiconductor chip 210 disposed on the upper package substrate 205, and an upper encapsulant 214 formed on the upper package substrate 205 to cover an active surface 210a of the upper semiconductor chip 210.

The upper package substrate 205 has a size suitable to accommodate the first and second lower package substrates 130 and 135 since the first and second lower package substrates 130 and 135 need to be mounted below the upper package substrate 205.

The upper semiconductor chip 210 may be connected to the upper package substrate 205 in a wire bonding scheme, a flip chip scheme, or the like. For example, the upper semiconductor chip 210 may be electrically connected to the first upper land 206 of the upper package substrate 205 through a wire 212.

The first and second inter-package connectors 220a and 220b are disposed between the first lower lands 106a and 106b of the first and second lower package substrates 130 and 135 and the second upper land 208 of the upper package substrate 205 to electrically connect the first and second lower semiconductor packages 150a and 150b to the upper semiconductor package 250.

The filler 300 may be formed to substantially, or alternatively, completely fill a gap between the first and second lower package substrates 130 and 135 and the upper package substrate 205 while substantially surrounding the first and second inter-package connectors 220a and 220b. In addition, the filler 300 may be formed to fill a space between the first lower semiconductor package 150a and the second lower semiconductor package 150b.

The filler 300 may improve the solder joint reliability of the first and second inter-package connectors 220a and 220b by relieving the thermal or mechanical stress being applied to the first and second inter-package connectors 220a and 220b. In addition, the filler 300 may suppress a warpage of the package by improving the stiffness of the stack type semiconductor package 510.

In an embodiment, the connections between the stack type semiconductor type package 510 and external devices, systems, circuit boards, substrates, or the like may be achieved through external connection members 114a and 114b. That is, the connection may be through two different substrates, the first and second lower package substrates 130 and 135.

Figure 3:
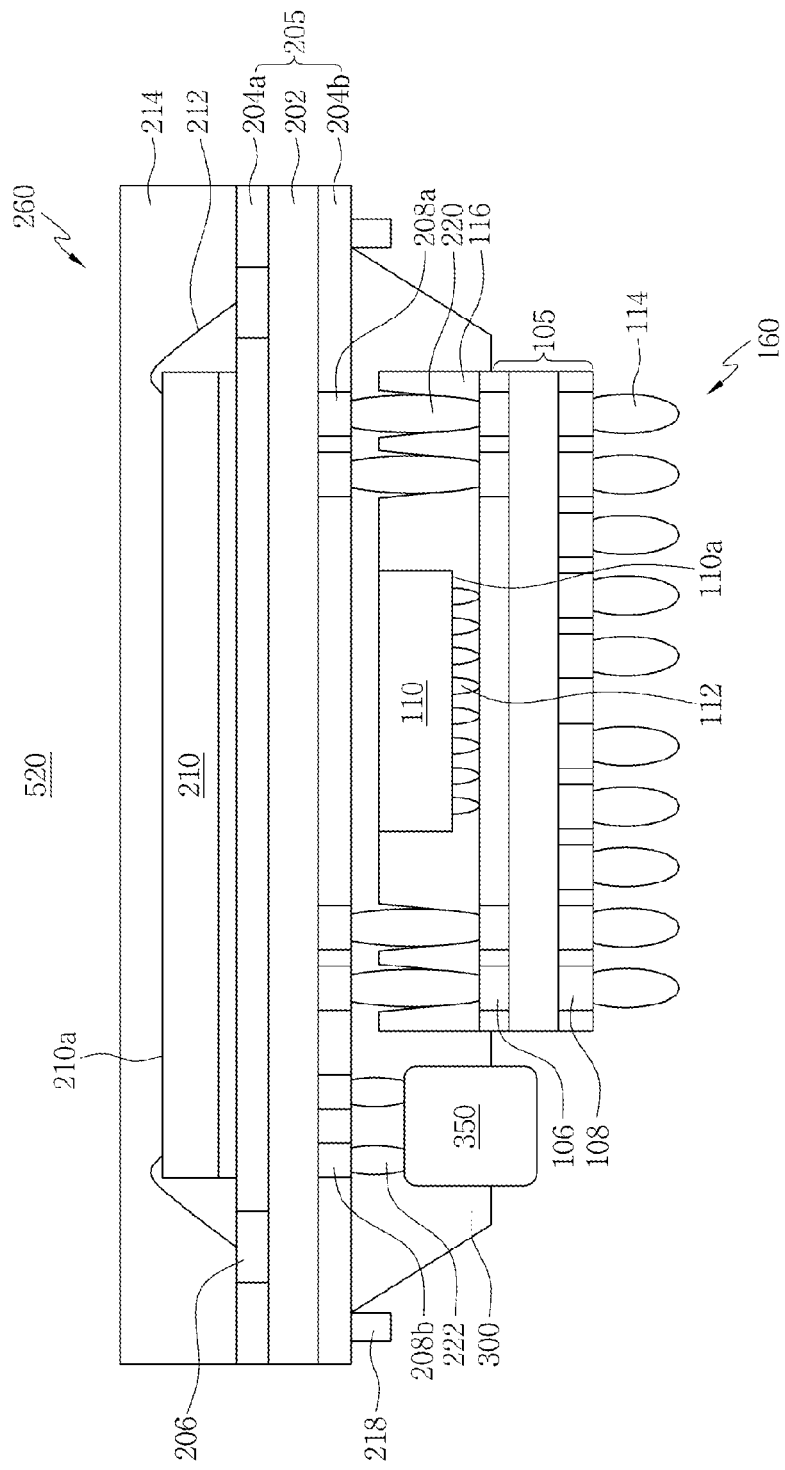

Referring to FIG. 3, a stack type semiconductor package 520 in accordance with an embodiment includes: a lower semiconductor package 160 including a lower package substrate 105 and at least one lower semiconductor chip 110 disposed on the lower package substrate 105; an upper semiconductor package 260 including an upper package substrate 205 having a size larger than that of the lower package substrate 105 and at least one upper semiconductor chip 210 disposed on the upper package substrate 205; inter-package connectors 220 electrically connecting the lower semiconductor package 160 to second upper lands 208a of the upper semiconductor package 260; and a filler 300 to substantially, or alternatively, completely fill a gap between the lower package substrate 105 and the upper package substrate 205 while substantially surrounding the inter-package connector 220.

In order to improve a signal integrity occurring when signals are transmitted in one or more crowded circuits as well as a power integrity occurring due to power interference, the stack type semiconductor package 520 may further include at least one passive device 350 mounted below the upper semiconductor package 260. For example, the passive device 350 may include a capacitor, a resistor, an inductor, or the like.

In addition, the stack type semiconductor package 520 may further include internal connection members 222 to electrically connect the upper package substrate 205 to the at least one passive device 350. The internal connection members 222 may be formed of the same material as that of the inter-package connectors 220. For example, the internal connection members 222 may be formed of a solder ball.

The internal connection member 222 is disposed between the second upper lands 208b of the upper package substrate 205 and the passive device 350, and may be substantially protected by the filler 300. The filler 300 may be formed to substantially fill a space between the lower semiconductor package 160 and the passive device 350.

Figure 4:
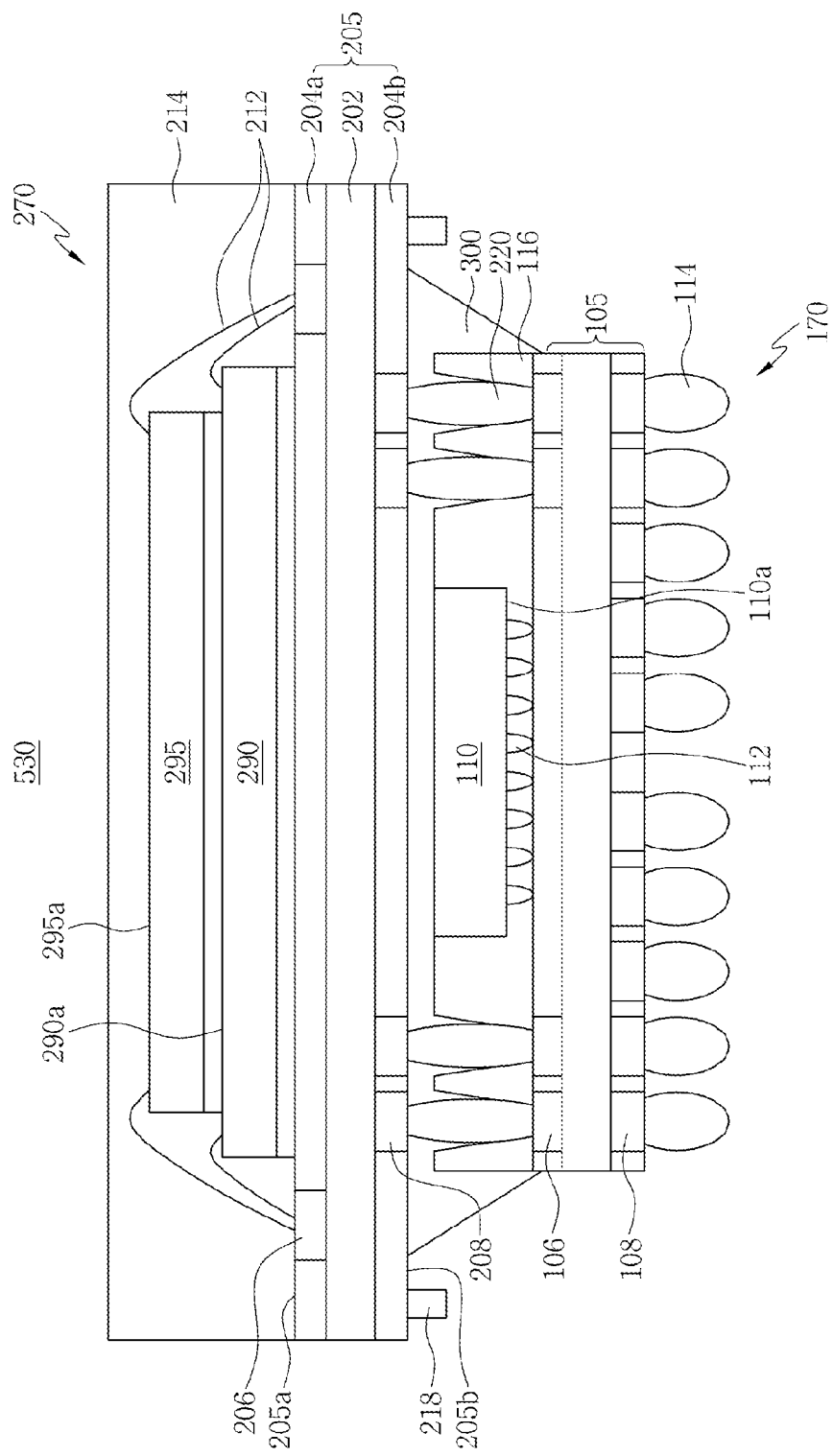

Referring to FIG. 4, a stack type semiconductor package 530 in accordance with an embodiment may include a lower semiconductor package 170, an upper semiconductor package 270, an inter-package connector 220, and a filer 300.

The lower semiconductor package 170 may include a lower package substrate 105, at least one lower semiconductor chip 110 disposed on the lower package substrate 105, and a lower encapsulant 116 formed on the lower package substrate 105 while substantially surrounding side surfaces of the lower semiconductor chip 110.

The upper semiconductor package 270 may include an upper package substrate 205 having a size larger than that of the lower package substrate 105, multiple upper semiconductor chips 290 and 295 vertically stacked on the upper package substrate 205, and an upper encapsulant 214 formed on the upper package substrate 205 to cover active surfaces 290a and 295a of the upper semiconductor chips 290 and 295. The upper semiconductor package 270 may be a multi-chip package (MCP) having a plurality of semiconductor chips vertically stacked. In addition, the upper semiconductor package 270 may have a structure in which multiple semiconductor chips are vertically stacked on multiple semiconductor chips horizontally disposed.

Each of the upper semiconductor chips 290 and 295 may have a different size, and may be electrically connected to each other through wires 212. In addition, each of the upper semiconductor chips 290 and 295 may be an integrated circuit configured to perform a different operation. For example, the upper semiconductor chips 290 and 295 may include a semiconductor memory device such as a dynamic random-access memory (DRAM), a static random-access memory (SRAM), a flash memory, a magnetoresistive random-access memory (MRAM), a ferroelectric random-access memory (FRAM), a phase-change random-access memory (PRAM), or the like.

The inter-package connector 220 may electrically connect the lower semiconductor package 170 to the upper semiconductor package 270, and may be protected by the filler 300. The filler 300 may be formed to substantially surround the lower encapsulant 116 while substantially, or alternatively, completely filling a gap between the lower package substrate 105 and the upper package substrate 205.

Figure 5:
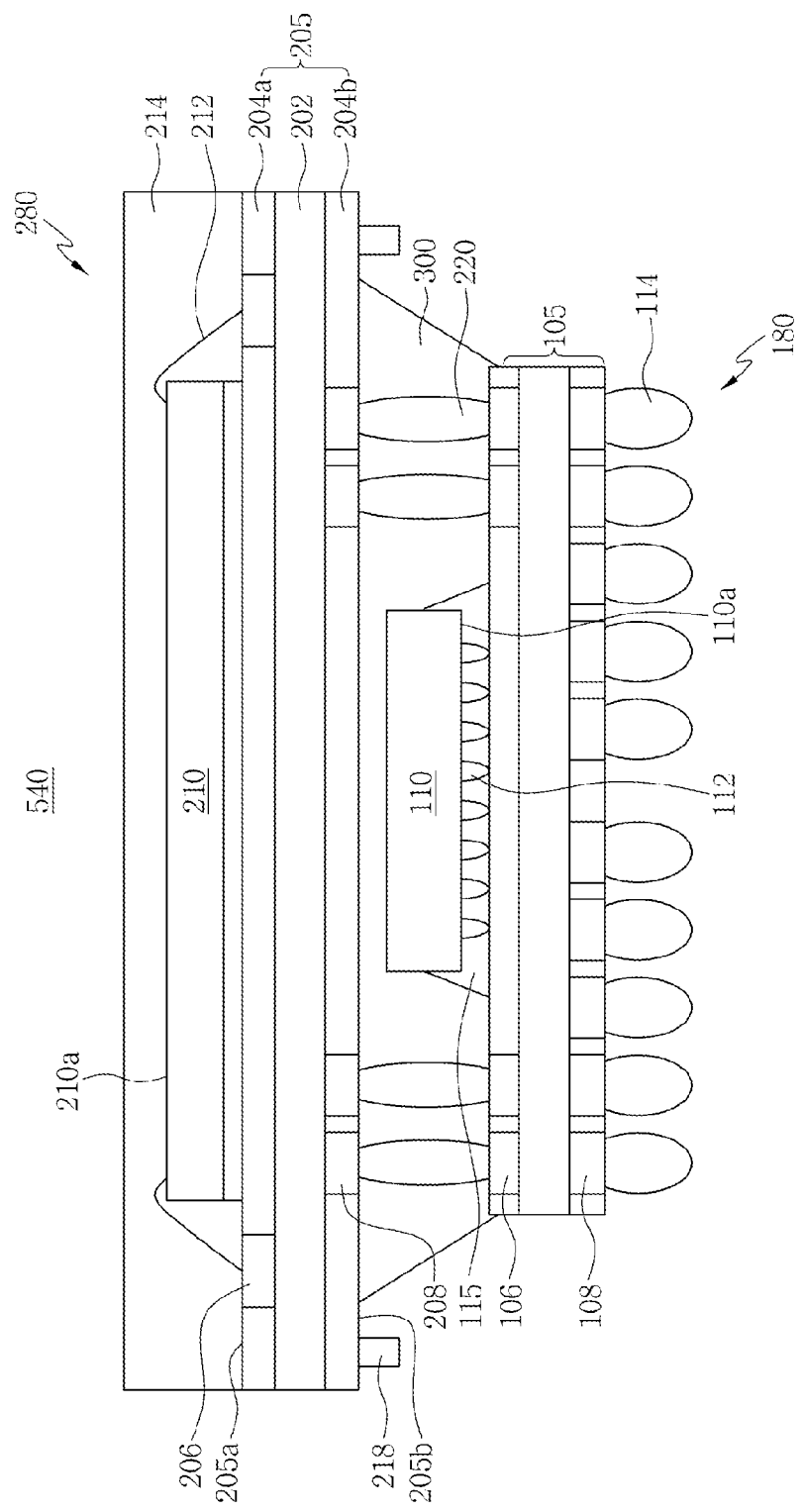

Referring to FIG. 5, a stack type semiconductor package 540 in accordance with an embodiment may include a lower semiconductor package 180 including a lower package substrate 105 and at least one lower semiconductor chip 110 disposed on the lower package substrate 105, an upper semiconductor package 280 including an upper package substrate 205 having a size larger than that of the lower package substrate 105 and at least one upper semiconductor chip 210 disposed on the upper package substrate 205, inter-package connectors 220 to electrically connect the lower semiconductor package 180 to the upper semiconductor package 280, and a filler 300 to substantially, or alternatively, completely fill a gap between the lower package substrate 105 and the upper package substrate 205 while surrounding the inter-package connectors 220.

The lower semiconductor chip 110 may be a flip chip package (FCP) obtained by disposing an active surface 110a, on which chip pads are formed, to face an upper surface 105a of the lower package substrate 105, and then directly connecting to the lower package substrate 105 using conductive chip bumps 112 disposed on the chip pads.

The lower semiconductor package 180 may further include an underfill member 115 to surround and protect the active surface 110a of the lower semiconductor chip 110 and the chip bumps 112. The underfill member 115 may be formed to fill a space between the active surface 110a of the lower semiconductor chip 110 and the lower package substrate 105. The underfill member 115 may be formed of an underfill resin such as an epoxy resin, or may include a silica filler or a silica flux.

The underfill member 115 may protect the chip bumps 112 disposed on the active surface 110a of the lower semiconductor chip 110 and relive a stress acting on the upper surface 105a of the lower package substrate 105.

The filler 300 may be formed to cover a region, on which the underfill member 115 is not formed, at the upper surface 105a of the lower package substrate 105. That is, the filler 300 may be formed to substantially surround the lower semiconductor chip 110 and the underfill member 115.

Figure 6B:
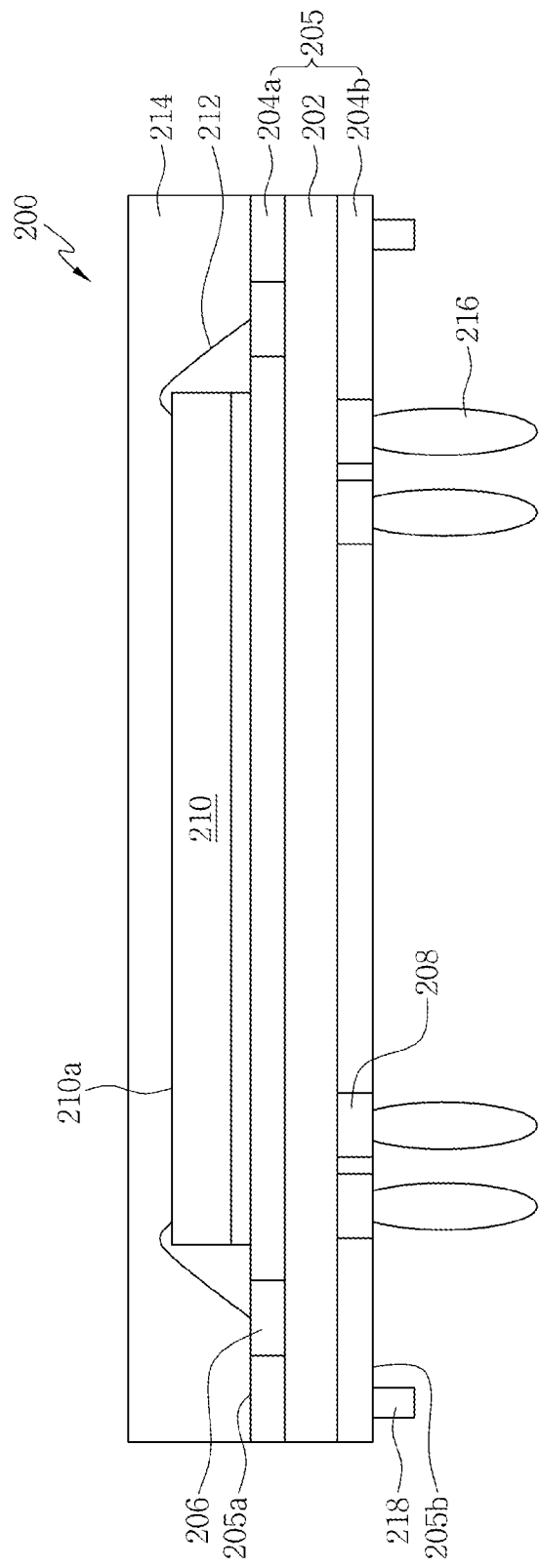
Figure 6C:
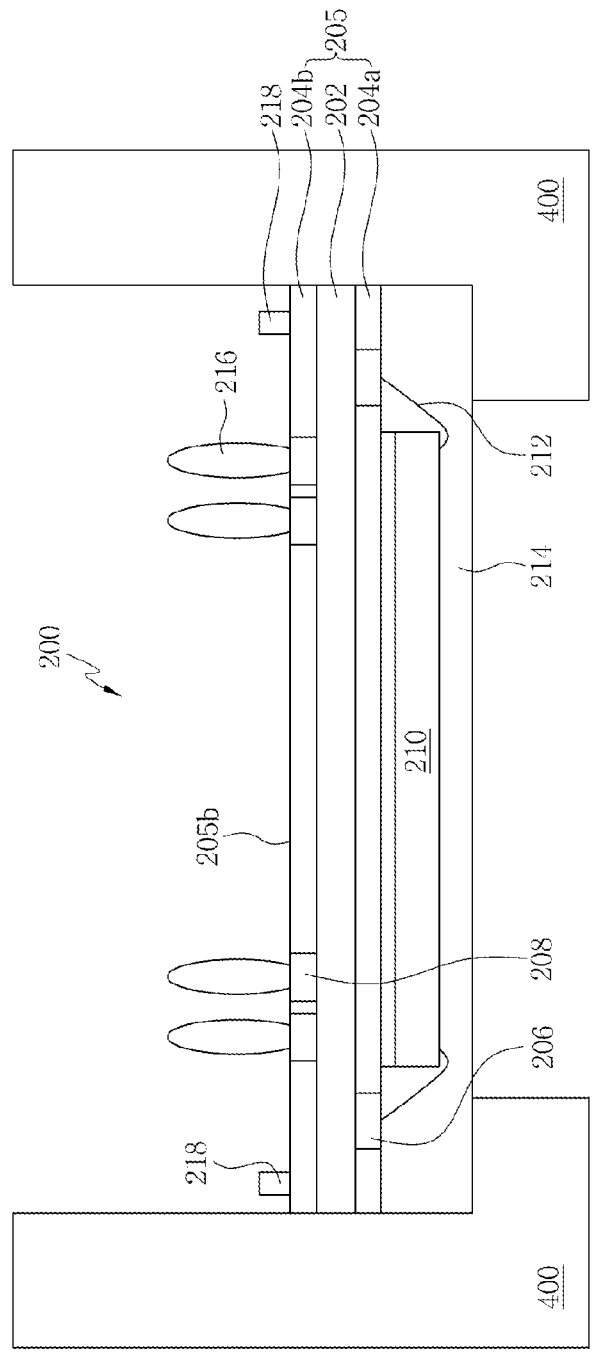
Figure 6D:
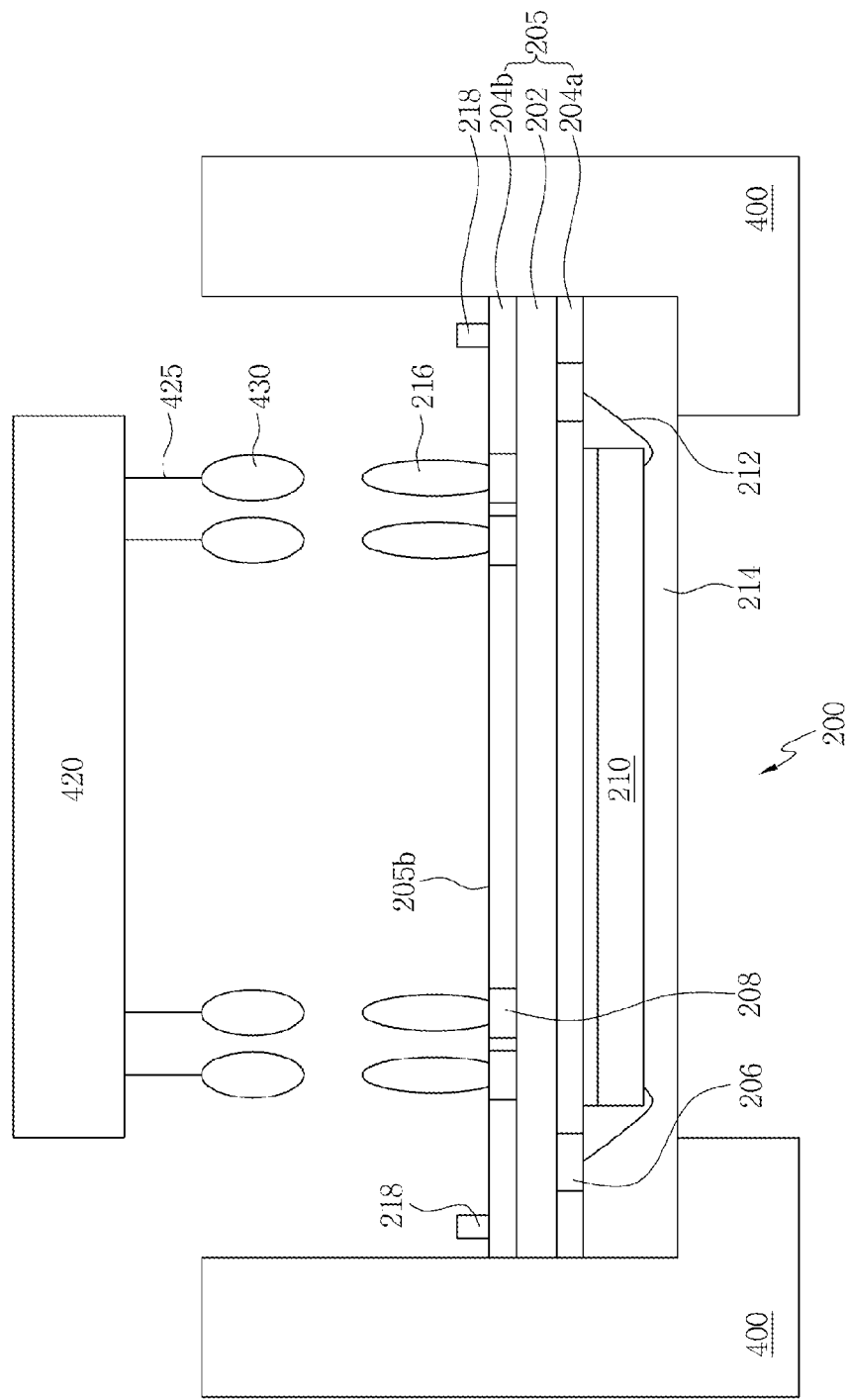
Figure 6F:
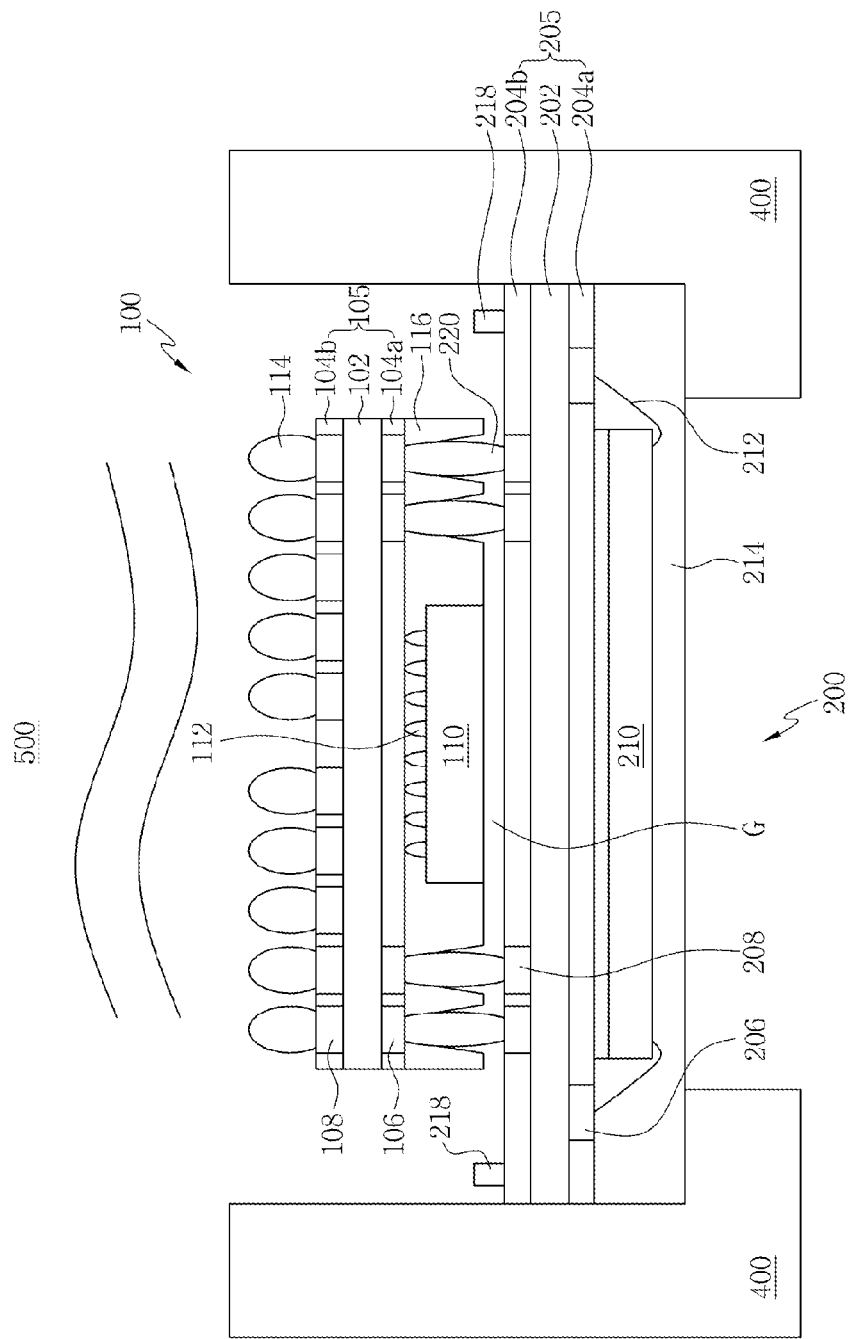
Figure 6G:
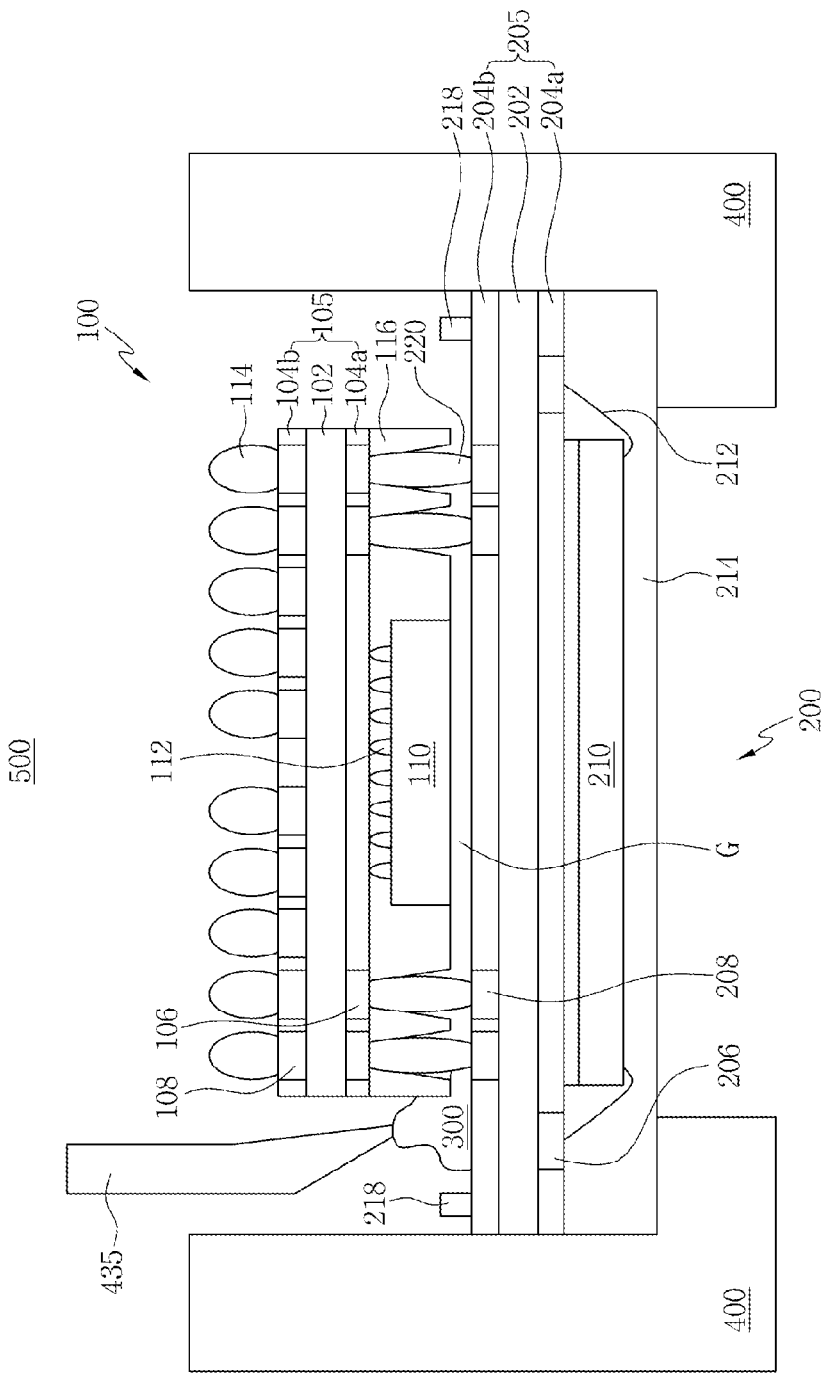
Figure 6H:
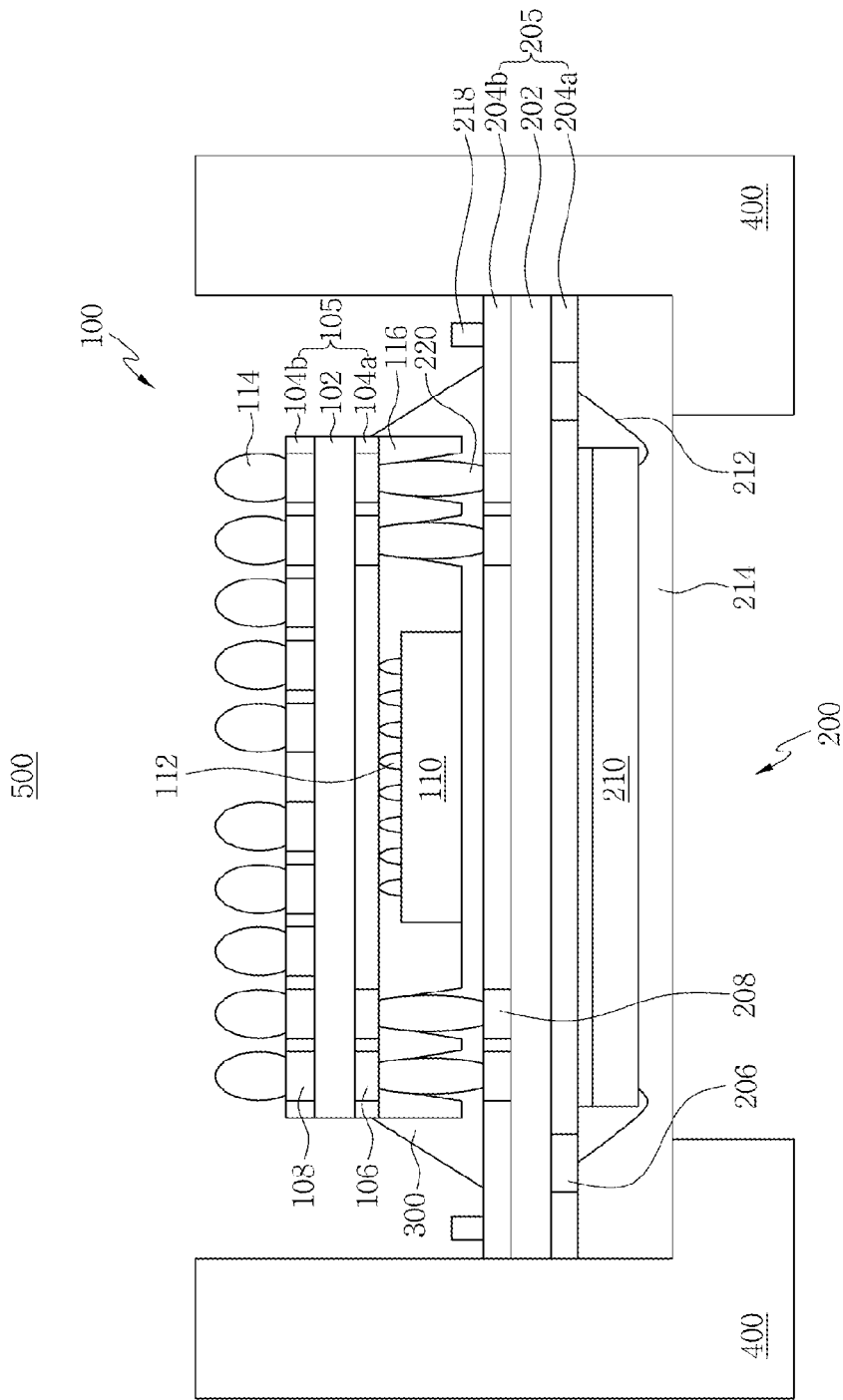
Figure 7A:
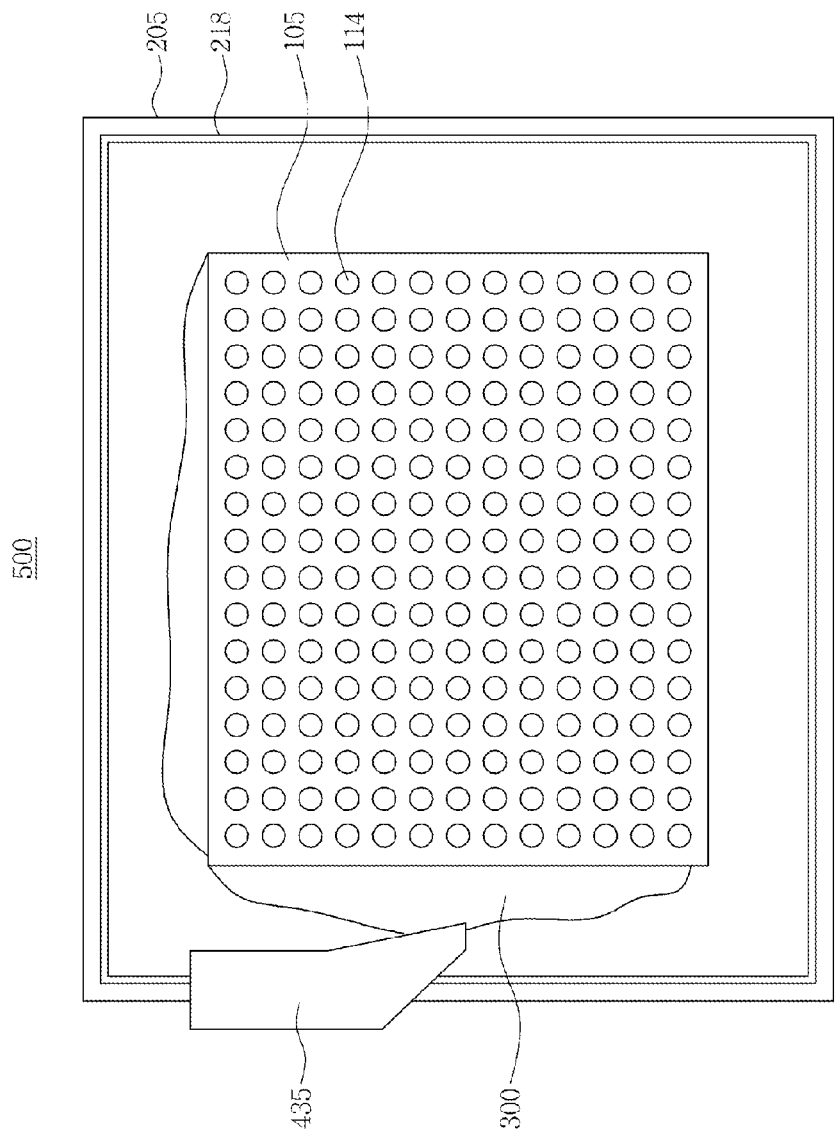
Figure 7B:
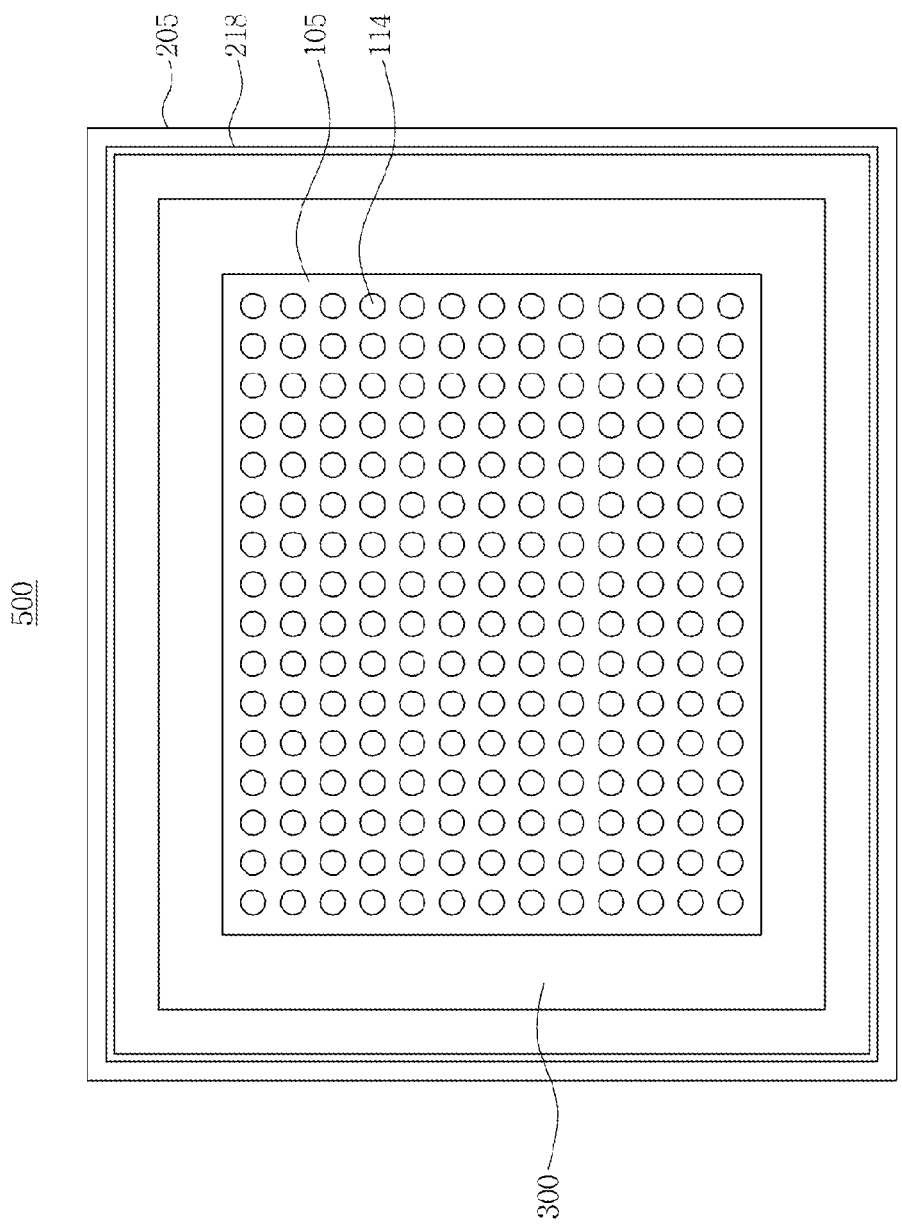

FIGS. 6A to 6H are cross-sectional views illustrating a method of manufacturing a stack type semiconductor package in accordance with various embodiments, and FIGS. 7A, 7B, and 8 are top views illustrating a method of manufacturing a stack type semiconductor package in accordance with various embodiments.

Referring to FIG. 6A, a method of manufacturing a stack type semiconductor package in accordance with an embodiments may include providing the lower semiconductor package 100 shown in FIG. 1.

First, the lower package substrate 105 having the lower core layer 102, the lower solder resist layers 104a and 104b, and the first and second lower lands 106 and 108 may be prepared. The lower package substrate 105 is a substrate in which multiple lower interconnections are formed, and may include a rigid printed circuit board, a flexible printed circuit board, or a rigid-flexible printed circuit board. The lower interconnections may be formed in the lower core layer 102. The first and second lower lands 106 and 108 may include copper, nickel, gold, a solder material, or the like.

The lower semiconductor chip 110 having the chip bumps 112 may be mounted to the lower package substrate 105 through a flip-chip scheme. That is, the active surface 110a of the lower semiconductor chip 110, on which the chip pads are formed, may be disposed to face the upper surface 105a of the lower package substrate 105, and then the lower semiconductor chip 110 may be mounted to the lower package substrate 105 using the chip bumps 112 disposed on the chip pads. The lower semiconductor chip 110 may be electrically connected to the first lower land 106 of the lower package substrate 105 through the chip bump 112. The lower semiconductor chip 110 may include a logic semiconductor device such as a microprocessor or a microcontroller. The lower semiconductor chip 110 may be a SOC having various types of semiconductor devices included in a single semiconductor chip. The chip bump 112 may include gold (Au), silver (Ag), platinum (Pt), aluminum (Al), copper (Cu), a solder material, or the like.

The lower encapsulant 116 may be formed to mold the lower package substrate 105 and the lower semiconductor chip 110 as a whole, while exposing the upper surface 110b of the lower semiconductor chip 110. The lower encapsulant 116 molds the upper surface 105a of the lower package substrate 105, to which the lower semiconductor chip 110 is mounted, as a whole. The lower encapsulant 116 may include an epoxy resin an epoxy mold compound (EMC), or the like.

Via holes 118 may be formed by performing a laser drill processing on the lower encapsulant 116 on the first lower lands 106. Lower connectors 120 may be formed in the via holes 118. The lower connectors 120 may include copper, nickel, gold, a solder material, or the like.

The lower connectors 120 may be formed in the same alignment with the first lower lands 106. The lower connectors 120 may be formed before the via holes 118 are formed. In a case in which the lower connectors 120 are formed after the via holes 118 are formed, the lower connectors 120 may be stably formed in the via hole 118 and the height of the lower connectors 120 may be easily adjusted. The lower connectors 120 may be formed at a height lower than a top of the via holes 118.

A backend process may be performed on the lower package substrate 105. The backend process may include a singulation process of sawing the lower package substrate 105 in chip units and a process of forming the external connection members 114 on the lower surface 105b of the lower package substrate 105.

The external connection members 114 may be formed in the same alignment with the second lower lands 108. The external connection members 114 may be formed of a solder material such as a solder ball, a solder bump, a solder paste, or the like, or formed of metal in the shape of a sphere, a mesa, a pin, or the like. The external connection members 114 may be arranged in a grid type to implement a ball grid array (BGA) package.

In this manner, there is a substantially completed the lower semiconductor package 100 including the lower package substrate 105 having the first and second lower lands 106 and 108, the lower semiconductor chip 110, the chip bump 112, the external connection members 114, the lower encapsulant 116, and the lower connector 120. Since the lower semiconductor package 100 is processed by a laser drill, the lower semiconductor package 100 may be referred to as a laser drill package (LDP).

Referring to FIG. 6B, the upper semiconductor package 200 shown in FIG. 1 may be provided.

The upper semiconductor package 200 may include the upper package substrate 205 having the upper core layer 202, the upper solder resist layers 204a and 204b, and the first and second upper lands 206 and 208. The upper package substrate 205 is a substrate in which upper interconnections are formed, and may include a rigid printed circuit board, a flexible printed circuit board, a rigid-flexible printed circuit board, or other substrate that may provide interconnections. The upper interconnections may be formed in the upper core layer 202 forming the upper package substrate 205. The first and second upper lands 206 and 208 may include copper, nickel, gold, a solder material, or the like.

The upper semiconductor chip 210 may be formed while interposing an attachment layer, such as a die attach film (DAF), between the upper semiconductor chip 210 and the upper surface 205a of the upper package substrate 205. The upper semiconductor chip 210 has chip pads on the active surface 210a thereof, and may include a semiconductor memory device. In order to increase a memory capacity, the size of the upper semiconductor chip 210 may need to be increased or multiple upper semiconductor chips may need to be stacked in a vertical or horizontal direction, and thus the upper package substrate 205 on which the upper semiconductor chip 210 is mounted may need to have a size larger than the lower package substrate 105.

The upper semiconductor chip 210 may be electrically connected to the first upper land 206 of the upper package substrate 205 through the wire 212. The wire 212 may include gold (Au), silver (Ag), platinum (Pt), aluminum (Al), copper (Cu), palladium (Pd), nickel (Ni), cobalt (Co), chrome (Cr), titanium (Ti), or the like.

The upper encapsulant 214 may be formed on the upper package substrate 205 to substantially surround and protect the active surface 210a of the upper semiconductor chip 210 and the wires 212. The upper encapsulant 214 may include an epoxy resin, an EMC, or the like.

Upper connectors 216 may be formed on the second upper lands 208 located on the lower surface 205b of the upper package substrate 205. The upper connector 216 may include copper, nickel, gold, a solder material, or the like.

The dam 218 may be formed along a periphery of the lower surface 205b of the upper package substrate 205. The dam 218 may be formed by printing a solder resist layer during a manufacturing process of the upper package substrate 205; however, other techniques may be used to form the dam 218.

Referring to FIG. 6C, the upper semiconductor package 200 may be mounted to a stack boat 400.

The stack boat 400 may make contact with the periphery of the upper semiconductor package 200. The upper semiconductor package 200 may be mounted to the stack boat 400 in an upside down manner such that the upper connectors 216 formed on the lower surface 205b of the upper package substrate 205 is oriented upward. That is, the upper semiconductor package 200 may be mounted in a way that the lower surface 205b of the upper package substrate 205 is oriented upward.

In case of a stack type semiconductor package having an upper package substrate and a lower package substrate each provided with the same size, the lower semiconductor package is mounted to a stack boat and then the upper semiconductor package is vertically stacked on the lower semiconductor package. However, in case of a stack type semiconductor package in an embodiment, having an upper package substrate larger than a lower package substrate, the upper semiconductor package 200 having a larger sized upper package substrate 205 is flipped over to be mounted on the stack boat 400, and then the lower semiconductor package may be vertically stacked on the upper semiconductor package 200.

Referring to FIG. 6D, a flux 430 may be dotted on the upper connector 216 by use of a flux-dotting device 420. The flux dotting device 420 having a plurality of flux pins 425 may be positioned such that the flux pins 425 corresponds to the upper connectors 216 formed on the lower surface 205b of the upper package substrate 205. The flux 430 is a material allowing metal to be chemically activated for easier connection with a solder material. The flux pins 425 may provide a flux in the form of a dot having a predetermined size and a pattern that corresponds to the stack type semiconductor package.

Referring to FIG. 6E, the lower semiconductor package 100 shown in FIG. 6A may be vertically stacked on the upper connector 216 that is flux dotted. The lower semiconductor package 100, after having the upper surface 110b of the lower semiconductor chip 110 disposed to face the lower surface 205b of the upper package substrate 205, may be stacked on the upper semiconductor package 100 in a way that the lower connectors 120 of the lower semiconductor package 100 correspond to the upper connectors 216 of the upper semiconductor package 200.

Referring to FIG. 6F, the inter-package connector 220 electrically connecting the lower semiconductor package 100 to the upper semiconductor package 200 may be formed. When the lower connector 120 of the lower semiconductor package 100 is vertically stacked on the flux dotted upper connector 216 of the upper semiconductor package 200 in one to one correspondence, a solder joint process may be performed to integrate the upper connector 216 of the upper semiconductor package 200 with the lower connector 120 of the lower semiconductor package 100.

Solders of the lower connector 120 and the upper connector 216 are reflowed to be integrated with each other by the solder joint process, thereby forming the inter-package connector 220 connecting the upper surface 105a of the lower package substrate 105 to the lower surface 205b of the upper package substrate 205. Accordingly, the stack type semiconductor package 500 having the lower semiconductor package 100 vertically stacked on the upper semiconductor package 200 is formed through the inter-package connector 220.

As needed, before the solder joint process, a cleaning process of cleaning surface contamination of the lower connector 120 and the upper connector 216 may be further performed. The cleaning process enables the lower connector 120 to be easily integrated with the upper connector 216 while ensuring sufficient electrical conductivity.

Referring to FIGS. 6G and 7A, the filler 300 may fill a gap G between the lower package substrate 105 and the upper package substrate 205. FIG. 7A is a top view of the stack type semiconductor package shown in FIG. 6G.

For example, the filler 300 may be formed through an underfill process using a capillary action. That is, the filler 300 may be inserted in a liquid state between the lower package substrate 105 and the upper package substrate 205 by use of an underfill dispenser 435. The filler 300 may be formed of an underfill resin such as an epoxy resin, a polymer-based material, or the like. In addition, the filler 300 may include a silica filler, a silica flux, or the like.

Referring to FIGS. 6H, 7B, and 8, the filler 300 filing the gap G between the lower package substrate 105 and the upper package substrate 205 may be cured. FIGS. 7B and 8 are top views of the stack type semiconductor package shown in FIG. 6H.

A thermal compression or a reflow process may be performed on the filler 300 inserted in a liquid state between the lower semiconductor chip 110 and the upper package substrate 205. While the thermal compression or the reflow process is performed, the filler 300 in a liquid state may be substantially, or alternatively, completely cured. During the reflow process, the dam 218 formed along the periphery of the lower surface of the upper package substrate 205 may substantially prevent the filler 300 from overflowing.

As for the stack type semiconductor package 500 having the upper package substrate 205 larger than the lower package substrate 105, the inter-package connector 220 is exposed without being sealed, thereby being vulnerable to an external shock or thermal cycle. Since the filler 300 substantially, or alternatively, completely fills the gap G between the lower package substrate 105 and the upper package substrate 205 to protect the inter-package connector 220, the mechanical stress or thermal stress applied to the inter-package connector 220 is relieved, thereby reducing if not preventing a crack from occurring on the inter-package connector 220. Accordingly, the filler 300 may improve the board level reliability of the inter-package connector 220.

In addition, since the filler 300 improves the stiffness of the stack type semiconductor package 500, warping, twisting, or the like of the package substrate may be substantially prevented when a high temperature heat treatment process, such as a reflow soldering process or a wave soldering process, is performed to mount the package substrate to a semiconductor module board or a system board through the external connection member 114 of the stack type semiconductor package 500.

Referring to FIGS. 6H and 7B, the filler 300 may be formed to substantially, or alternatively, completely fill the gap G between the lower package substrate 105 and the upper package substrate 205 while surrounding the lower encapsulant 116 of the lower package substrate 105.

In addition, referring to FIGS. 6H and 8, the filler 300 may be formed to substantially, or alternatively, completely fill the gap G between the lower package substrate 105 and the upper package substrate 205 while substantially, or alternatively, completely filling the space between the dam 218 of the upper package substrate 205 and the lower encapsulant 116.

In describing a method of manufacturing a stack type semiconductor package in accordance with various embodiments, the parts identical to those according to the previous embodiment will be omitted, and the following description will be made in relation to a modified part from the above-described embodiment.

In some embodiments, as illustrated in FIGS. 7B and 8, a perimeter of the upper package substrate 205 substantially surrounds the perimeter of the lower package substrate 105. Accordingly, the filler 300 may, but need not extend to the perimeter of the upper package substrate 205 or the dam 218 yet still substantially surround the inter-package connectors 220.

FIGS. 9A to 12B are cross-sectional views illustrating manufacturing methods of stack type semiconductor packages in accordance with various embodiments.

Figure 9A:
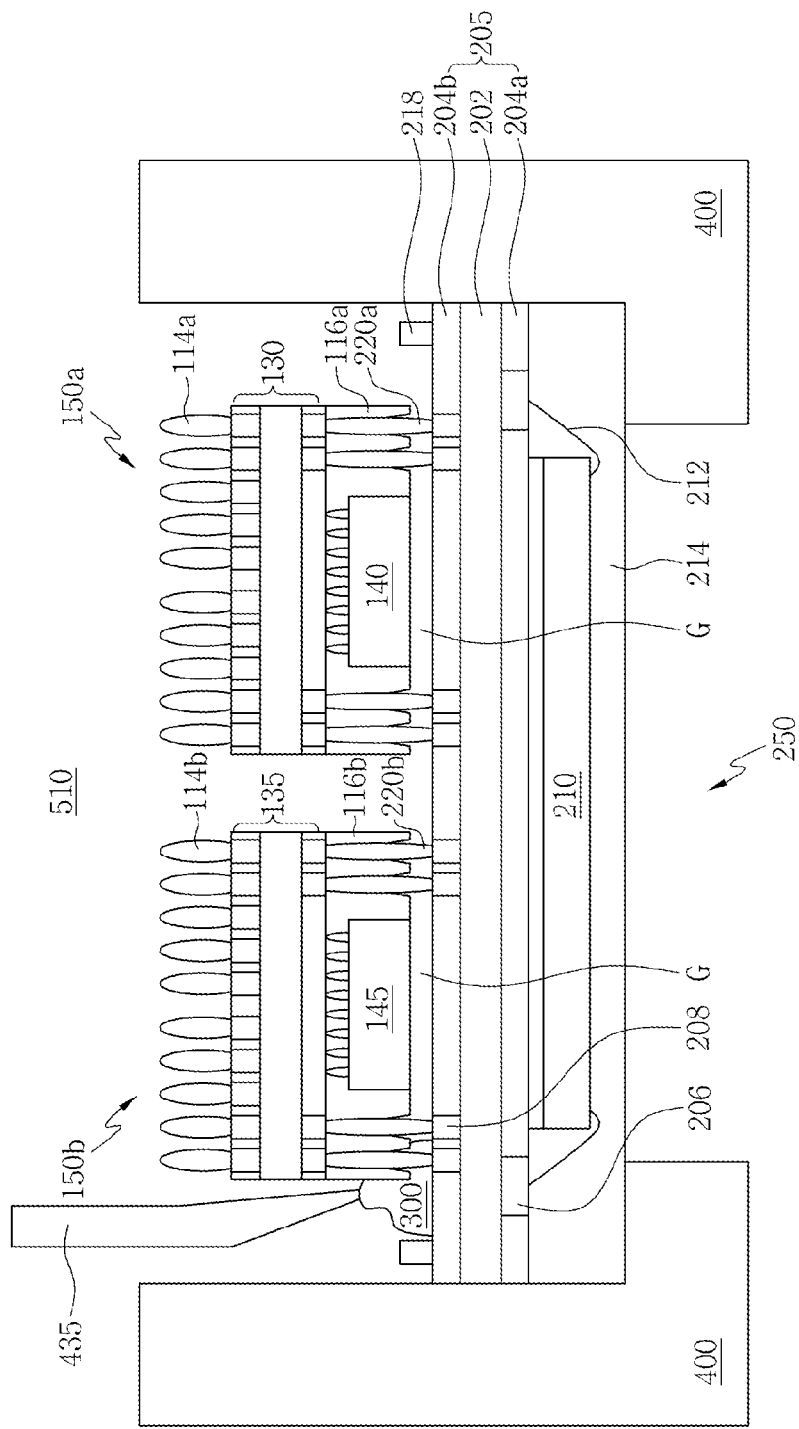
FIGS. 9A to 12B are cross-sectional views illustrating manufacturing methods of stack type semiconductor packages in accordance with various embodiments.

Referring to FIG. 9A, a method of manufacturing the stack type semiconductor type package 510 in accordance with an embodiment includes mounting the upper semiconductor package 250 shown in FIG. 2 to the stack boat 400 in an upside down manner such that the lower surface 205b of the upper package substrate 205 is oriented upward.

After a flux dotting is performed on the upper semiconductor package 250, the first and second lower semiconductor packages 150a and 150b shown in FIG. 2 may be vertically stacked on the upper semiconductor package 250. The first and second lower semiconductor packages 150a and 150b may be disposed such that the active surfaces 140a and 140b of the first and second lower semiconductor chips 140 and 145 face the lower surface 205b of the upper package substrate 205.

As a solder joint process is performed, the first and second inter-package connectors 220a and 220b electrically connecting the upper package substrate 205 of the upper semiconductor package 250 to the first and second lower package substrates 130 and 135 of the first and second lower semiconductor packages 150a and 150b, respectively, may be formed.

The gap G between the first and second lower package substrates 130 and 135 and the upper package substrate 205 may be filled with the filer 300. The filler 300 may be inserted in a liquid state between the first and second lower package substrates 130 and 135 and the upper package substrate 205 by use of the underfill dispenser 435.

Figure 9B:
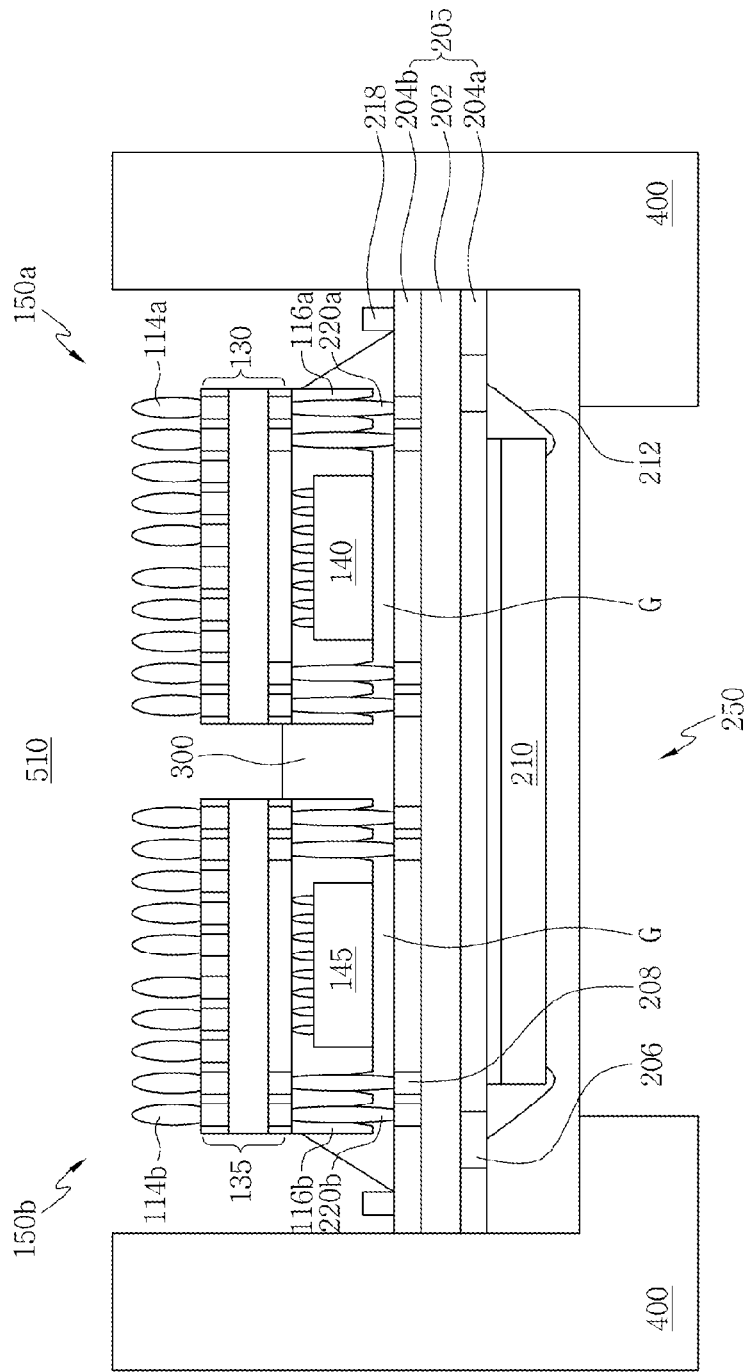

Referring to FIG. 9B, the filler 300 filling the gap G between the first and second lower package substrates 130 and 135 and the upper package substrate 205 may be cured.

The filler 300 may be formed to fill the space between the first lower package substrate 130 and the second lower package substrate 135 while substantially surrounding the first and second lower encapsulants 116a and 116b on the first and second lower package substrates 130 and 135.

The cured filler 300 may improve the board level reliability of the first and second inter-package connectors 220a and 220b and improve the stiffness of the stack type semiconductor package 510, thereby suppressing the warpage of the package substrate.

Figure 10A:
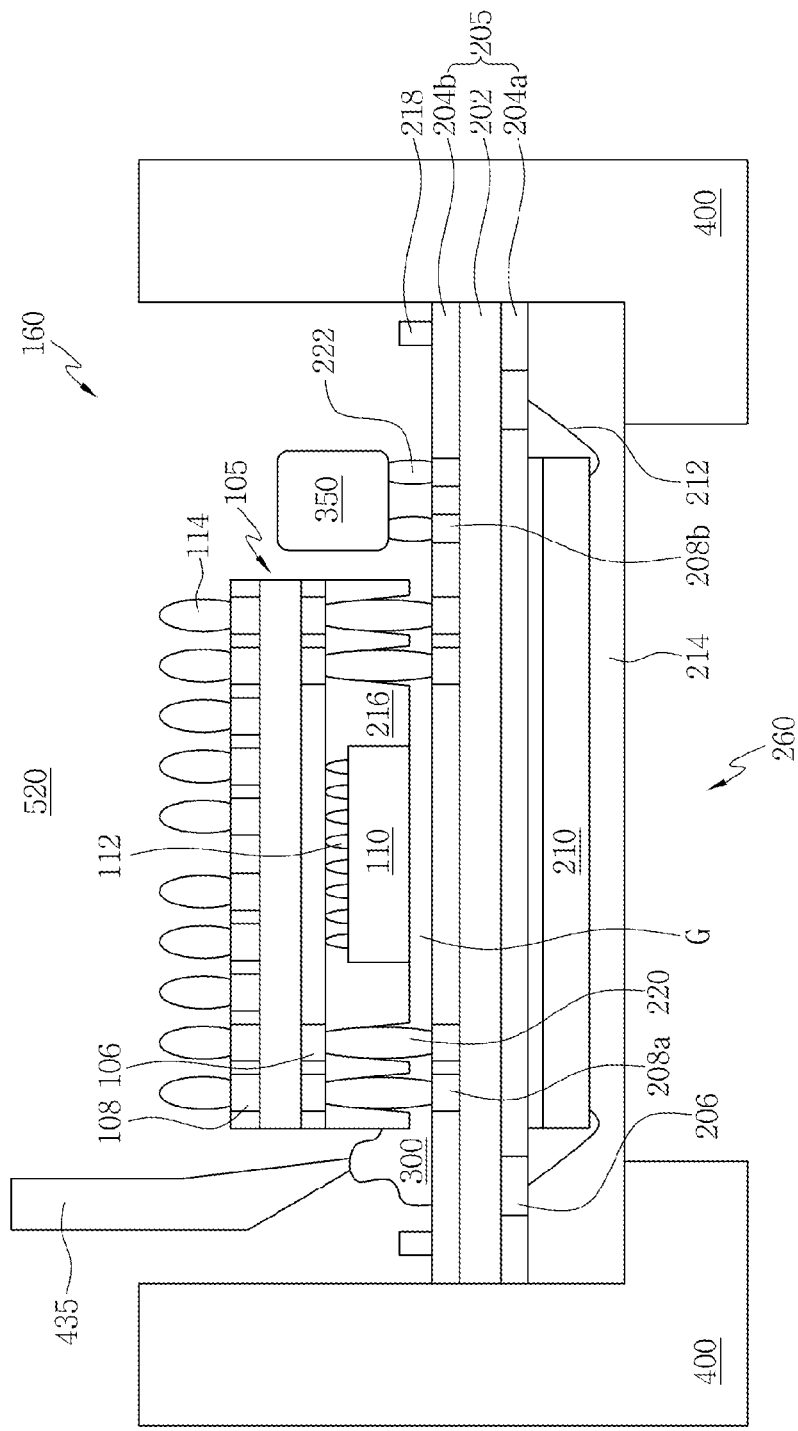

Referring to FIG. 10A, a method of manufacturing the stack type semiconductor package 520 in accordance with an embodiment may include mounting the upper semiconductor package 260 shown in FIG. 3 on the stack boat 400 in an upside down manner.

After a flux dotting is performed on the upper semiconductor package 260, the lower semiconductor package 160 and the passive device 350 shown in FIG. 3 may be vertically stacked on the upper semiconductor package 260.

As a solder joint process is performed, the inter-package connector 220 electrically connecting the upper package substrate 205 of the upper semiconductor package 260 to the lower package substrate 105 of the lower semiconductor package 160 may be formed as well as the internal connection member 222 electrically connecting the upper package substrate 205 to the passive device 350.

Through the underfill process using the underfill dispenser 435, the gap G between the lower package substrate 105 and the upper package substrate 205 may be substantially filled with the filler 300.

Figure 10B:
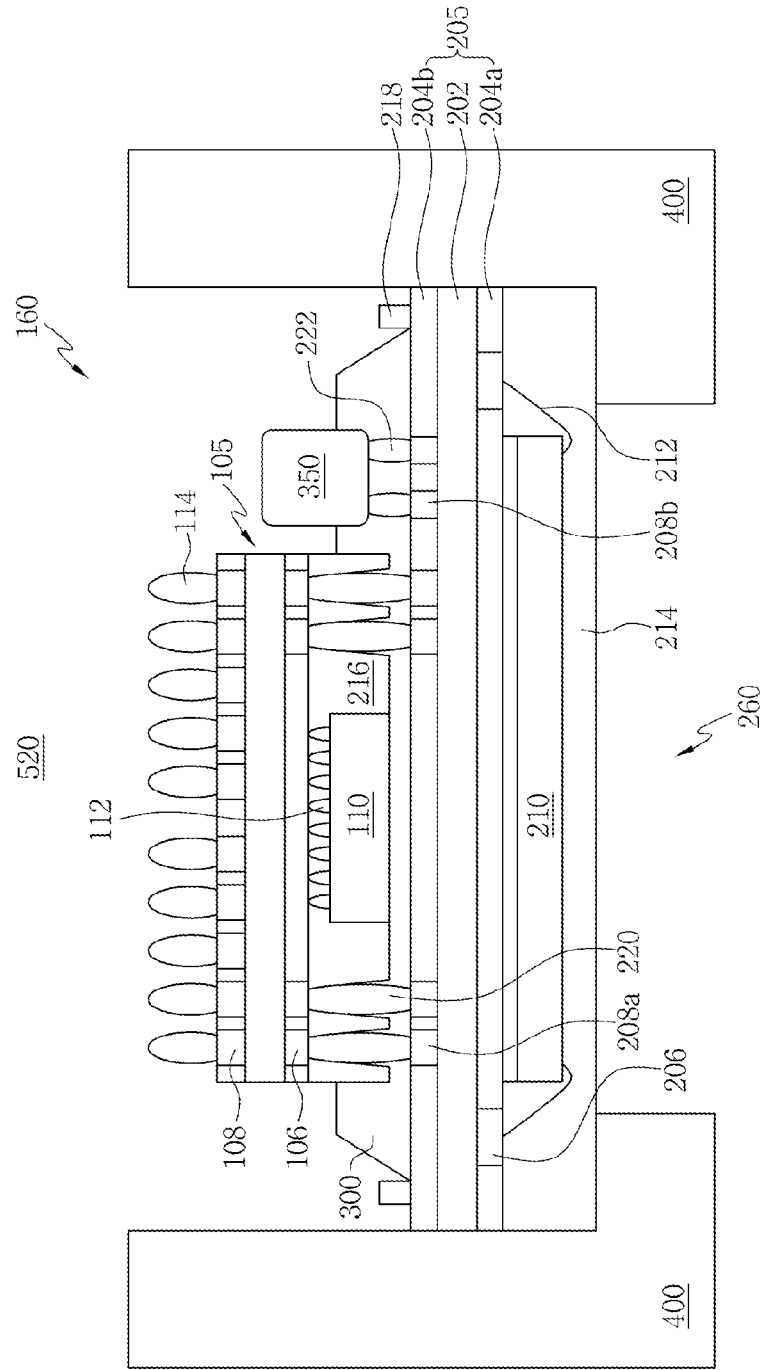

Referring to FIG. 10B, the filler 300 may be cured. The filler 300 may be formed to fill the gap G between the lower package substrate 105 and the upper package substrate 205 while substantially surrounding the inter-package connector 220 and the lower encapsulant 116. In addition, the filler 300 may substantially fill the space between the lower package substrate 105 and the passive device 350 while substantially surrounding the internal connection member 222. The cured filler 300 may improve the board level reliability of the inter-package connector 220 and suppress the warpage of the stack type package substrate 520.

Figure 11A:
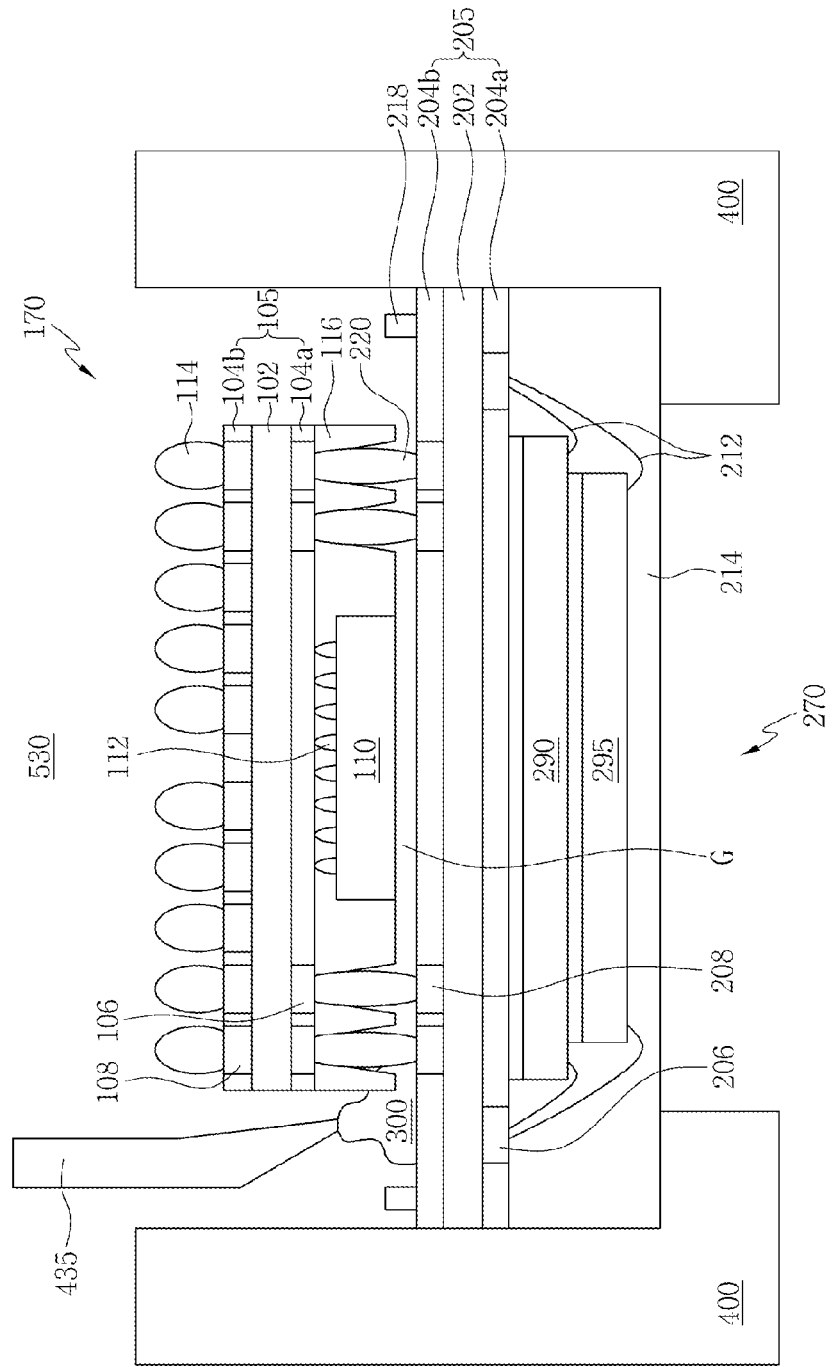

Referring to FIG. 11A, a method of manufacturing the stack type semiconductor package 530 in accordance with an embodiment may include mounting the upper semiconductor package 270 shown in FIG. 4 on the stack boat 400 in an upside down manner.

After a flux dotting is performed on the upper semiconductor package 270, the lower semiconductor package 170 shown in FIG. 4 may be vertically stacked on the upper semiconductor package 270.

As a solder joint process is performed, the inter-package connectors 220 electrically connecting the upper package substrate 205 of the upper semiconductor package 270 to the lower package substrate 105 of the lower semiconductor package 170 may be formed.

Through the underfill process using the underfill dispenser 435, the gap G between the lower package substrate 105 and the upper package substrate 205 may be substantially filled with the filler 300.

Figure 11B:
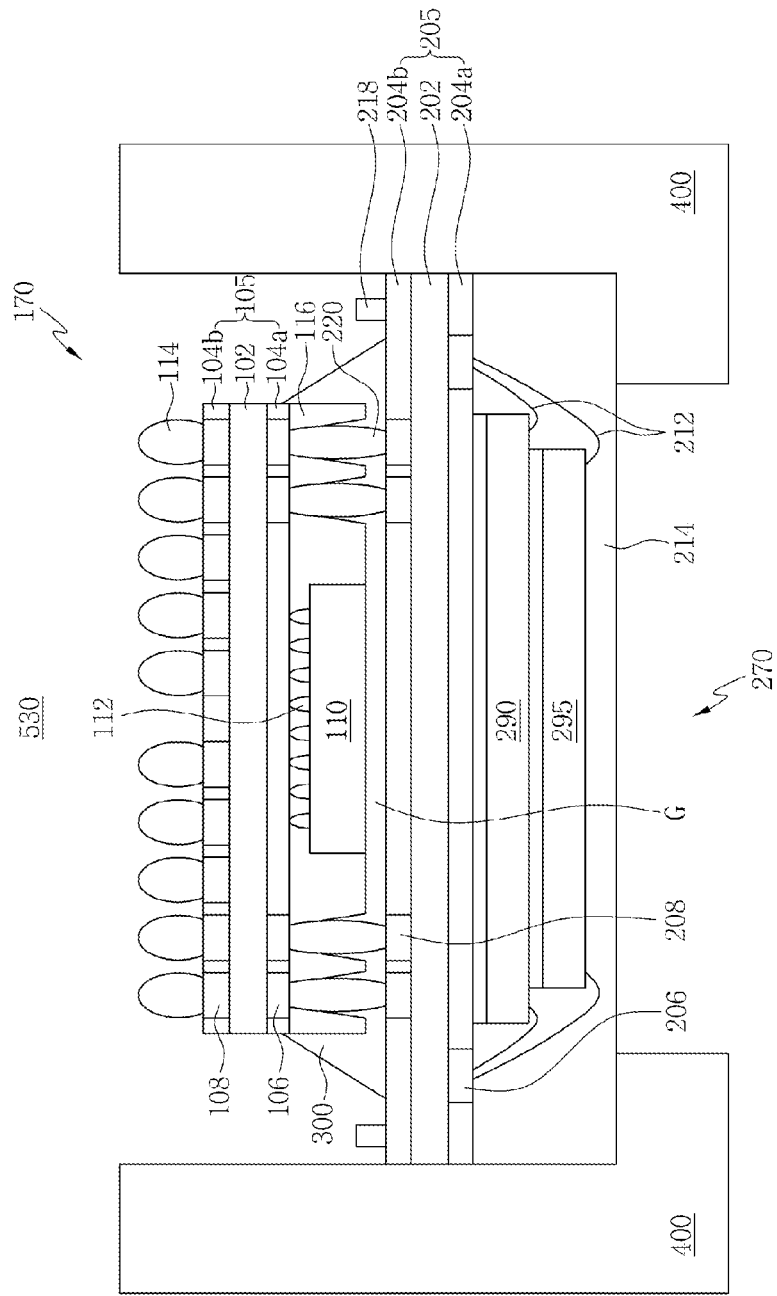

Referring to FIG. 11B, the filler 300 may be cured.

The filler 300 may be formed to substantially fill the gap G between the lower package substrate 105 and the upper package substrate 205 while surrounding the inter-package connector 220 and the lower encapsulant 116.

The cured filler 300 may improve the board level reliability of the inter-package connector 220 and suppress the warpage of the stack type semiconductor package 530.

Figure 12A:
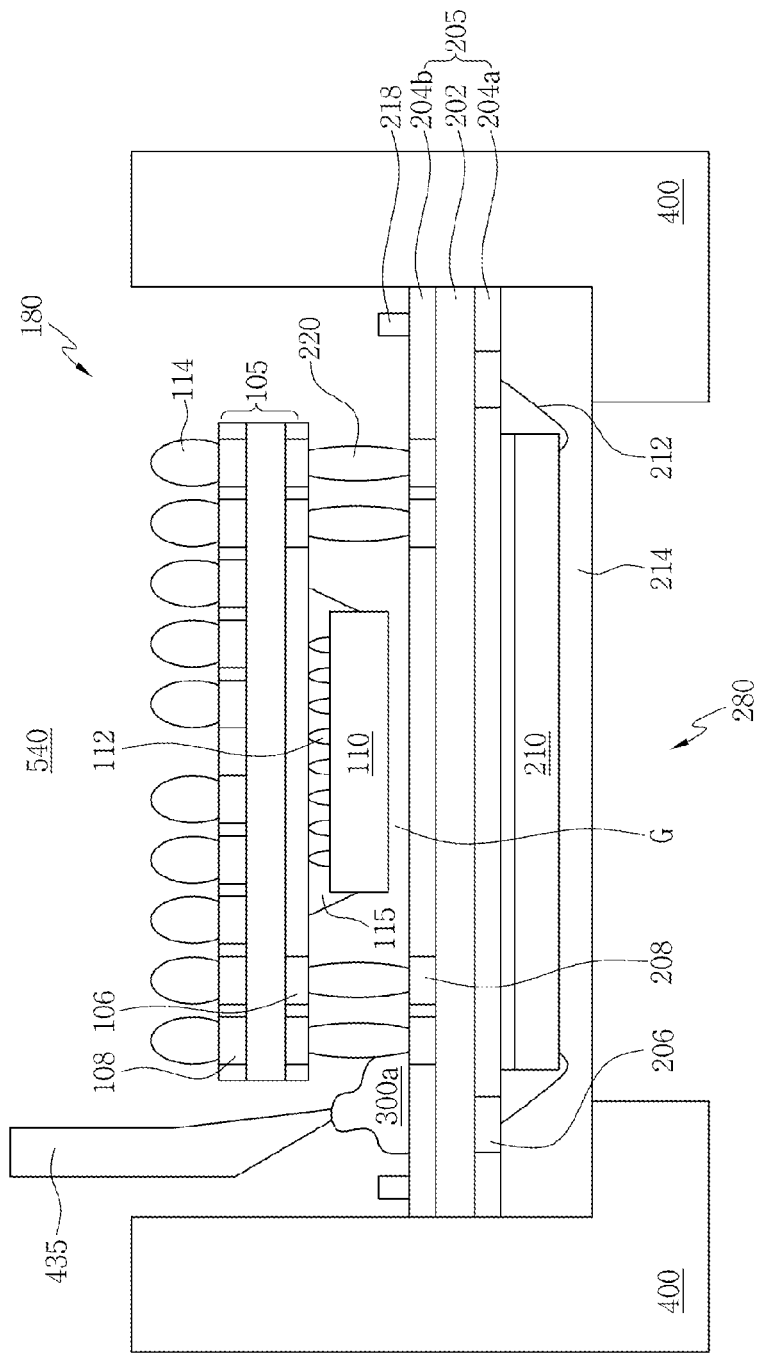

Referring to FIG. 12A, a method of manufacturing the stack type semiconductor package 540 in accordance with an embodiment may include mounting the upper semiconductor package 280 shown in FIG. 5 on the stack boat 400 in an upside down manner.

After a flux dotting is performed on the upper semiconductor package 280, the lower semiconductor package 180 shown in FIG. 5 may be vertically stacked on the upper semiconductor package 280.

As a solder joint process is performed, the inter-package connector 220 electrically connecting the upper package substrate 205 of the upper semiconductor package 280 to the lower package substrate 105 of the lower semiconductor package 180 may be formed.

Through the underfill process using the underfill dispenser 435, the gap G between the lower package substrate 105 and the upper package substrate 205 may be substantially filled with the filler 300.

Figure 12B:
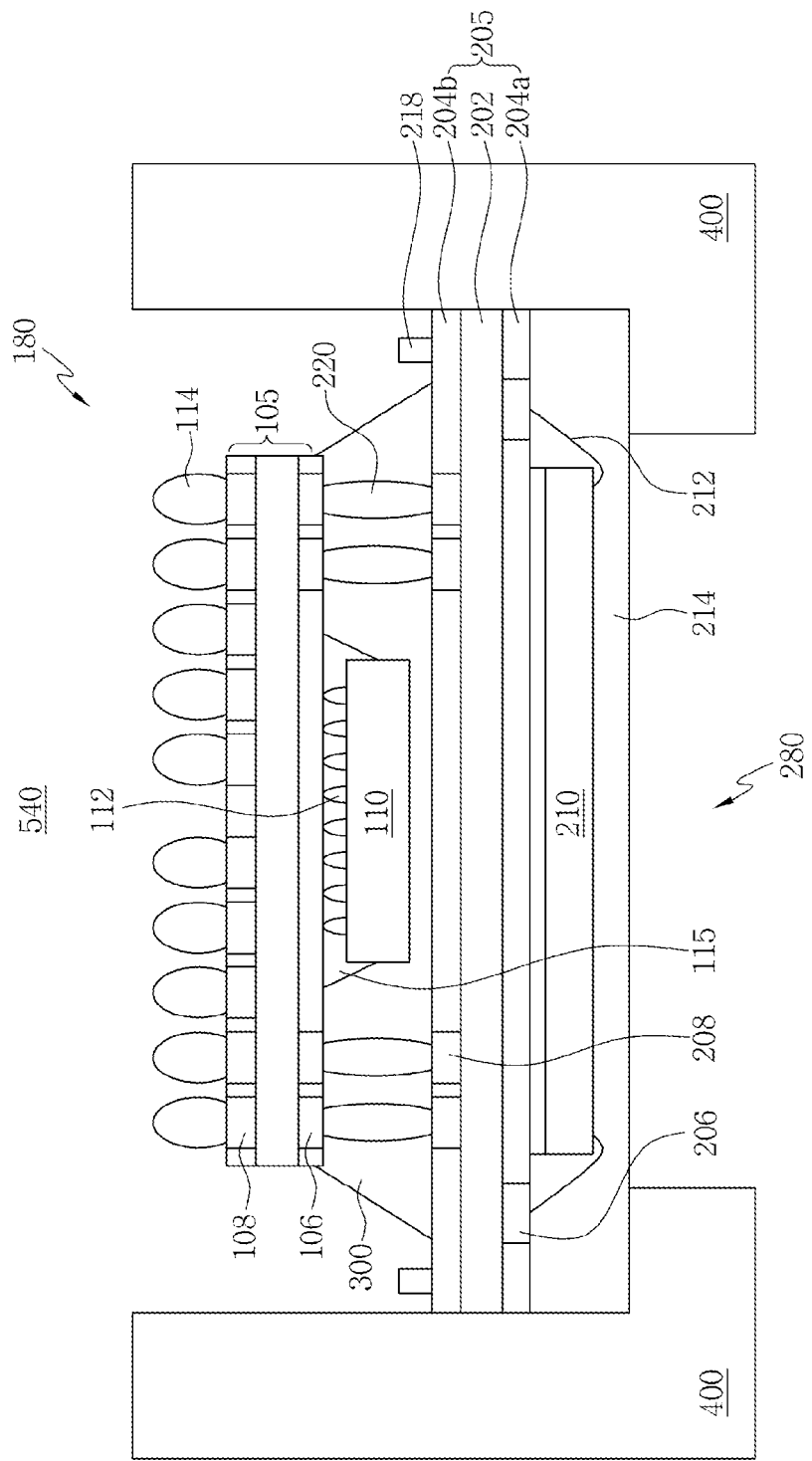

Referring to FIG. 12B, the filler 300 may be cured. The filler 300 may be formed to substantially fill the gap G between the lower package substrate 105 and the upper package substrate 205 while surrounding the inter-package connector 220. In addition, the filler 300 may be formed to substantially surround the lower semiconductor chip 110 of the lower semiconductor package 180 and the underfill member 115. The cured filler 300 may improve the board level reliability of the inter-package connector 220 and suppress the warpage of the stack type package substrate 540.

Figure 13:
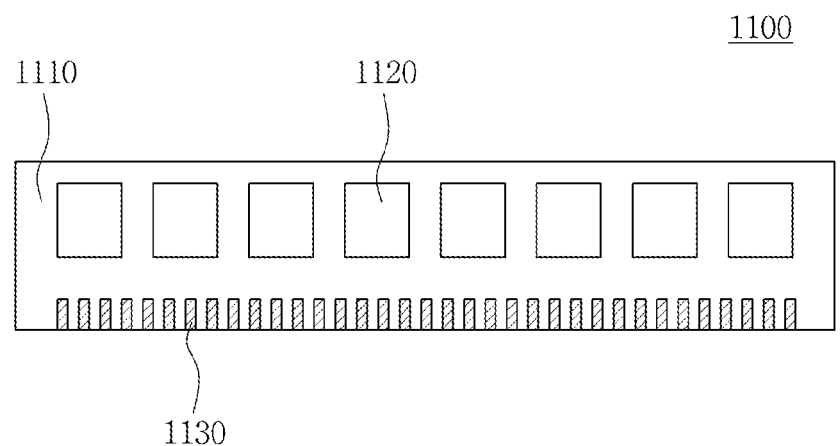
FIG. 13 is a schematic view of a semiconductor module having a stack type semiconductor package in accordance with various embodiments.

FIG. 13 is a schematic view of a semiconductor module having a stack type semiconductor package in accordance with various embodiments. Referring to FIG. 13, a semiconductor module 1100 having a package-stacked structure in accordance with an embodiment mounted thereon includes a module substrate 1110, semiconductor devices or stack type semiconductor packages 1120 being disposed on the module substrate 1110, and module contact terminals 1130 formed at an edge of the module substrate 1110 and electrically connected to the semiconductor devices or stack type semiconductor packages 1120, respectively.

The module substrate 1110 may be a printed circuit board (PCB) or other suitable substrate for semiconductor packages. Both surfaces of the module substrate 1110 may be available for use. That is, the semiconductor devices or stack type semiconductor packages 1120 may be disposed at both a front surface and a rear surface of the module substrate 1110.

The semiconductor module 1100 may further include an additional controller or a chip set to control the semiconductor devices or stack type semiconductor packages 1120.

The module contact terminals 1130 may be formed of metal, and may have anti-oxidation property. The module contact terminals 1130 may be variously set while conforming to the standards of the module substrate 1110.

Figure 14:
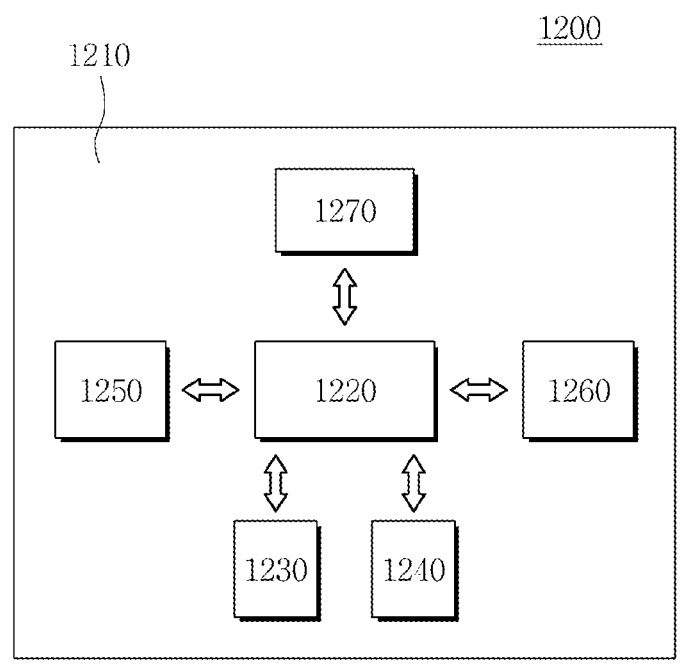
FIG. 14 is a block diagram schematically illustrating an electronic circuit board including a stack type semiconductor package in accordance with various embodiments.

FIG. 14 is a block diagram schematically illustrating an electronic circuit board including a stack type semiconductor package in accordance with various embodiments. Referring to FIG. 14, an electronic circuit board in accordance with an embodiment 1200 includes: a microprocessor 1220 disposed on a circuit board 1210; a main storage circuit 1230 and a supplementary storage circuit 1240 configured to communicate with the microprocessor 1220; an input signal processing circuit 1250 configured to transmit a command to the microprocessor 1220; an output signal processing circuit 1260 configured to receive a command from the microprocessor 1220; and a communicating signal processing circuit 1270 configured to transmit and receive an electrical signal to/from other circuit boards, devices, systems, or the like. Arrows shown in FIG. 14 may be understood as a path that delivers an electrical signal.

The microprocessor 1220 is configured to receive various electrical signals and process the received electrical signals to output a result of the processing, and control other components of the electronic circuit board 1200. The microprocessor 1220, for example, may be understood as a central processing unit (CPU) and/or a main control unit (MCU).

The main storage circuit 1230 may be configured to temporarily store data that is always or frequently required by the microprocessor 1220 or data obtained before and after the processing. The main storage circuit 1230, which may have a high-speed response, may be formed of a semiconductor memory device. In detail, the main storage circuit 1230 may be a semiconductor memory device, called 'a cache,' a static random access memory (SRAM), a dynamic random access memory (DRAM), a resistive random access memory (RRAM), an applied semiconductor device thereof, e.g., a utilized RAM, a ferro-electric RAM, a fast cycle RAM, a phase changeable RAM, and a magnetic RAM, and other semiconductor memory devices. The semiconductor device may be included in various types of stack type semiconductor packages in accordance with the inventive concept. In addition, the main storage circuit 1230 may include a volatile or non-volatile random access memory. In accordance with this embodiment, the main storage circuit 1230 may include the semiconductor module 1100 having the stack type semiconductor packages similar to those described herein.

The supplementary storage circuit 1240 is a large capacity memory device, and may be a non-volatile semiconductor memory, such as a flash memory, or a hard disk drive using a magnetic field. Alternatively, the supplementary storage circuit 1240 may be an optical compact disk drive. The supplementary storage circuit 1240 may be used when a large capacity of data needs to be stored, rather than requiring a speed as fast as the main storage circuit 1230. The supplementary storage circuit 1240 may include the semiconductor module 1100 having the stack type semiconductor packages similar to those described herein.

The input signal processing circuit 1250 may be configured to convert an external command to an electrical signal, or may be configured to transmit an external electrical signal to the microprocessor 1220. The external command or electrical signal may be a command for operation, an electrical signal to be processed, or data to be stored. The input signal processing circuit 1250 may be a terminal signal processing circuit configured to process a signal that is transmitted from a keyboard, a mouse, a touchpad, an image recognition device, or various sensors; an image signal processing circuit configured to process an image signal input of a scanner or a camera; various types of sensors; or an input signal interface. The input signal processing circuit 1250 may include the semiconductor module 1100 having the stack type semiconductor packages similar to those described herein.

The output signal processing circuit 1260 may be a component configured to output an electric signal, which has been processed by the microprocessor 1220. For example, the output signal processing circuit 1260 may be a graphic card, an image processor, an optical transducer, a beam panel card, or an interface circuit having various functions. The output signal processing circuit 1260 may include the semiconductor module 1100 having the stack type semiconductor packages similar to those described herein.

The communicating signal processing circuit 1270 is a component configured to directly transmit and receive an electrical signal to/from another electronic system or another circuit board without passing through the input signal processing circuit 1250 or the output signal processing circuit 1260. For example, the communicating signal processing circuit 1270 may be a modem, a local area network (LAN) card, or various interface circuits of a personal computer system. The communicating signal processing circuit 1270 may include the semiconductor module 1100 having the stack type semiconductor packages similar to those described herein.

Figure 15:
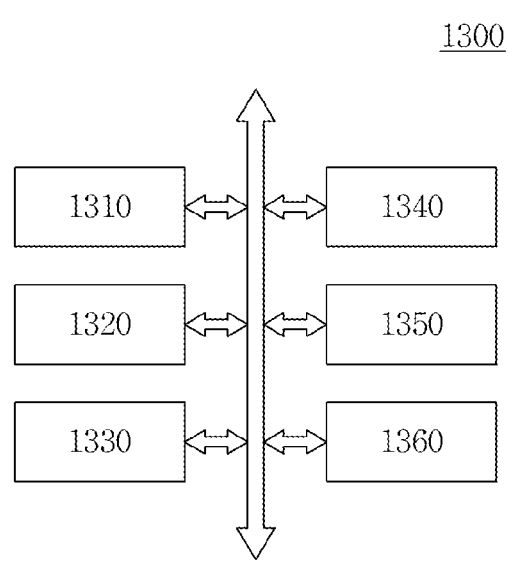
FIG. 15 is a block diagram schematically illustrating an electronic system including a semiconductor module having a stack type semiconductor package in accordance with various embodiments.

FIG. 15 is a block diagram schematically illustrating an electronic system including a semiconductor module having a stack type semiconductor package in accordance with various embodiments. Referring to FIG. 15, an electronic system 1300 in accordance with the inventive concept includes a control unit 1310, an input unit 1320, an output unit 1330, and a storage unit 1340, and may further include a communication unit 1350 and/or an operation unit 1360.

The control unit 1310 may be configured to control the overall operation of the electronic system 1300 and the respective parts of the electronic system 1300. The control unit 1310 may be understood as a central processing unit or a central control unit, and may include the electronic circuit board 1200 in accordance with the inventive concept. In addition, the control unit 1310 may include the semiconductor module 1100 having the stack type semiconductor packages similar to those described herein.

The input unit 1320 may be configured to transmit an electrical command signal to the control unit 1310. The input unit 1320 may be a keyboard, a keypad, a mouse, a touchpad, an image-recognizing device, such as a scanner, or various input sensors. The input unit 1320 may include the semiconductor module 1100 having the stack type semiconductor packages similar to those described herein.

The output unit 1330 may be configured to receive an electrical command signal from the control unit 1310 to output a result processed by the electronic system 1300. The output unit 1330 may be a monitor, a printer, a beam exposer, or various mechanical devices. The output unit 1330 may include the semiconductor module 1100 having the stack type semiconductor packages similar to those described herein.

The storage unit 1340 may be a component to temporarily or permanently store an electrical signal that is to be processed or has been processed by the control unit 1310. The storage unit 1340 may physically or electrically connected or coupled to the control unit 1310. The storage unit 1340 may be a semiconductor memory, a magnetic storage device such as a hard disk, an optical storage device such as a compact disc, or a server having a data storage function. In addition, the storage unit 1340 may include the semiconductor module 1100 having the stack type semiconductor packages similar to those described herein.

The communication unit 1350 may be configured to receive an electrical command signal from the control unit 1310, and to transmit or receive an electrical signal to/from another electronic system. The communication unit 1350 may be a wired transmission/reception device such as a modem and a LAN card, a wireless transmission/reception device such as a WIBRO interface, or an infrared port. In addition, the communication unit 1350 may include the semiconductor module 1100 having the stack type semiconductor packages similar to those described herein.

The operation unit 1360 may be configured to perform a physical or mechanical operation according to a command of the control unit 1310. For example, the operation unit 1360 may be a component such as, for example, a plotter, an indicator, and an up/down operator, to perform a mechanical operation. The electronic system 1300 may be a computer, a network server, a networking printer or scanner, a wireless controller, a mobile communication-purpose terminal, a switching apparatus, or other electronic products capable of performing a programmed operation.

As can be seen from the foregoing, in an embodiment, a filler is filled in between an upper package substrate and a lower package substrate, each having a different size, to minimize stress being applied to an inter-package connector, thereby improving the board level reliability of the inter-package connector. In addition, the stiffness of the stack type semiconductor package is improved, thereby suppressing a warpage of the package substrate due to a thermal attack.

Embodiments provide a stack type semiconductor package having a superior solder joint reliability. According to one aspect, there is provided a stack type semiconductor package comprising a lower semiconductor package, an upper semiconductor package, an inter-package connector, and a filler. The lower semiconductor package includes a lower package substrate and at least one lower semiconductor chip disposed on the lower package substrate. The upper semiconductor package includes an upper package substrate larger than the lower package substrate and at least one upper semiconductor chip disposed on the upper package substrate. The inter-package connector connects an upper surface of the lower package substrate to a lower surface of the upper package substrate. The filler fills in between the lower package substrate and the upper package substrate while surrounding the inter-package connector.

In some embodiments, the filler may include an epoxy resin or a polymer-based material.

In another embodiment, the stack type semiconductor package may further include at least one passive device disposed on the lower surface of the upper package substrate, and an internal connection member connecting the lower surface of the upper package substrate to the at least one passive device. The filler may be formed to surround the internal connection member while filling a space between the lower semiconductor package and the passive device. The internal connection member may be formed of the same material as that of the inter-package connector.

In still another embodiment, the stack type semiconductor package may further include a lower encapsulant formed on the lower package substrate while surrounding a side of the lower semiconductor chip. The filler may be formed to surround the lower encapsulant.

In yet another embodiment, the stack type semiconductor package may further include an underfill member formed between the upper surface of the lower package substrate and the lower semiconductor chip. The filler may be formed to surround the lower semiconductor chip and the underfill member.

In yet another embodiment, the stack type semiconductor package may further include an upper encapsulant formed on the upper package substrate to cover the upper semiconductor chip.

In yet another embodiment, the stack type semiconductor package may further include a dam formed along a periphery of the lower surface of the upper package substrate. The filler may be limited by the dam.

According to another aspect, there is provided a stack type semiconductor package comprising at least one lower semiconductor package, an upper semiconductor package, an inter-package connector, and a filler. The at least one lower semiconductor package includes a lower package substrate and at least one lower semiconductor chip disposed on the lower package substrate. The upper semiconductor package includes an upper package substrate larger than the lower package substrate and at least one upper semiconductor chip disposed on the upper package substrate. The inter-package connector connects the at least one lower semiconductor package to the upper semiconductor package. The filler fills in between the lower package substrate and the upper package substrate while surrounding the inter-package connector.

In some embodiments, the filler may be formed to surround the at least one lower semiconductor package.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this disclosure and as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as being limited to the specific embodiments disclosed, and that modifications to the disclosed embodiments, as well as other embodiments, are intended to be included within the scope of the appended claims.

What is claimed is:

1. A stack type semiconductor package comprising:
a lower semiconductor package including a lower package substrate and at least one lower semiconductor chip disposed on the lower package substrate;
an upper semiconductor package including an upper package substrate larger than the lower package substrate and at least one upper semiconductor chip disposed on the upper package substrate;
an inter-package connector connecting an upper surface of the lower package substrate to a lower surface of the upper package substrate;
a filler filling in between the lower package substrate and the upper package substrate while substantially surrounding the inter-package connector;
at least one passive device disposed on the lower surface of the upper package substrate; and
an internal connection member connecting the lower surface of the upper package substrate to the at least one passive device,
wherein the filler is formed to substantially surround the internal connection member while filling a space between the lower semiconductor package and the passive device.

2. The stack type semiconductor package according to claim 1, wherein the internal connection member is formed of the same material as that of the inter-package connector.

3. The stack type semiconductor package according to claim 1, further comprising a lower encapsulant formed on the lower package substrate while substantially surrounding a side of the lower semiconductor chip.

4. The stack type semiconductor package according to claim 3, wherein the filler is formed to substantially surround the lower encapsulant.

5. The stack type semiconductor package according to claim 1, further comprising an underfill member formed between the upper surface of the lower package substrate and the lower semiconductor chip.

6. The stack type semiconductor package according to claim 5, wherein the filler is formed to substantially surround the lower semiconductor chip and the underfill member.

7. The stack type semiconductor package according to claim 1, further comprising an upper encapsulant formed on the upper package substrate to cover the upper semiconductor chip.

8. The stack type semiconductor package according to claim 1, further comprising a dam formed along a periphery of the lower surface of the upper package substrate.

9. The stack type semiconductor package according to claim 8, wherein the filler is limited by the dam.

10. The stack type semiconductor package according to claim 1, wherein:
the filler substantially fills a gap between the upper package substrate and the lower package substrate; and
the filler extends beyond a perimeter of the lower package substrate.

11. The stack type semiconductor package according to claim 10, wherein a perimeter of the upper package substrate substantially surrounds the perimeter of the lower package substrate in plan view.

12. The stack type semiconductor package according to claim 1, further comprising a plurality of external connection members disposed on the lower package substrate and configured to electrically connect at least one of the at least one lower semiconductor chip and at least one upper semiconductor chip to an external device.

13. A stack type semiconductor package comprising:
- a plurality of lower semiconductor packages, each including a lower package substrate and at least one lower semiconductor chip disposed on the lower package substrate;
- an upper semiconductor package including an upper package substrate larger than the lower package substrates of the lower semiconductor packages and at least one upper semiconductor chip disposed on the upper package substrate;
- inter-package connectors connecting the lower semiconductor packages to the upper semiconductor package;
- a filler filling in between the lower package substrates and the upper package substrate while substantially surrounding the inter-package connectors; and
- a dam formed along a periphery of a lower surface of the upper package substrate and configured to limit the filler.

14. The stack type semiconductor package according to claim 13, further comprising a plurality of external connection members configured to electrically connect at least one of the at least one upper semiconductor chip, and the lower semiconductor chips of the lower semiconductor packages to at least one external device through the lower package substrates of the lower semiconductor packages.

15. The stack type semiconductor package according to claim 13, wherein the filler is formed to substantially surround the lower semiconductor packages.

\* \* \* \* \*